(12) United States Patent
Ode

(10) Patent No.: US 11,856,880 B2
(45) Date of Patent: Dec. 26, 2023

(54) SEMICONDUCTOR STORAGE DEVICE

(71) Applicant: Kioxia Corporation, Tokyo (JP)

(72) Inventor: Hiroyuki Ode, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 245 days.

(21) Appl. No.: 17/191,241

(22) Filed: Mar. 3, 2021

(65) Prior Publication Data

US 2022/0085291 A1     Mar. 17, 2022

(30) Foreign Application Priority Data

Sep. 17, 2020   (JP) ................ 2020-156749

(51) Int. Cl.
*G11C 5/02*   (2006.01)
*H10N 70/00*   (2023.01)
*H01L 23/00*   (2006.01)
*H10B 63/00*   (2023.01)

(52) U.S. Cl.
CPC ......... *H10N 70/8845* (2023.02); *H01L 24/46* (2013.01); *H10B 63/00* (2023.02); *H10N 70/011* (2023.02)

(58) Field of Classification Search
CPC ............. H10N 70/8845; H10N 70/011; H10N 70/063; H10N 70/231; H10N 70/826; H10N 70/841; H10N 70/8828; H10N 70/24; H01L 24/46; H01L 23/528; H01L 23/5283; H10B 63/00; H10B 63/24; H10B 63/80; H10B 63/845; G11C 5/063; G11C 7/14; G11C 5/025
See application file for complete search history.

(56) References Cited

U.S. PATENT DOCUMENTS

| | | | |
|---|---|---|---|
| 2005/0044522 A1* | 2/2005 | Maeda | H01L 27/11803 430/5 |
| 2007/0221957 A1* | 9/2007 | Kitajima | H01L 27/092 257/202 |
| 2009/0166676 A1* | 7/2009 | Lee | H01L 29/66628 257/192 |
| 2009/0230450 A1 | 9/2009 | Shiino et al. | |

(Continued)

FOREIGN PATENT DOCUMENTS

| | | |
|---|---|---|
| JP | 2011-018838 A | 1/2011 |
| TW | 202010096 A | 3/2020 |

(Continued)

*Primary Examiner* — Bitew A Dinke
(74) *Attorney, Agent, or Firm* — Foley & Lardner LLP

(57) ABSTRACT

A semiconductor storage device includes a first region, a second region, and a third region. The first region includes first wirings extending in a first direction, second wirings extending in a second direction, and a memory cells provided at intersections of the first and second wirings. The second region includes a contact extending in a third direction. The third region includes first dummy wirings extending in the first direction, and a second dummy wirings extending in the second direction. A width in the first direction of a first one of the second dummy wirings, closest to the first region or the second region in the first direction, is equal to or less than a width in the first direction of a second one of the second dummy wirings next closest to the first region or the second region in the first direction.

13 Claims, 32 Drawing Sheets

(56) References Cited

U.S. PATENT DOCUMENTS

| | | | |
|---|---|---|---|
| 2011/0069524 A1* | 3/2011 | Toba | G11C 17/165 |
| | | | 365/210.1 |
| 2011/0095374 A1* | 4/2011 | Kawahara | H01L 27/0207 |
| | | | 716/122 |
| 2012/0187500 A1* | 7/2012 | Shinkawata | H01L 27/0207 |
| | | | 257/E21.632 |
| 2013/0062707 A1* | 3/2013 | Lien | H01L 21/76229 |
| | | | 257/E29.007 |
| 2013/0249113 A1* | 9/2013 | Baba | H10N 70/20 |
| | | | 257/776 |
| 2015/0263024 A1* | 9/2015 | Hishida | H10B 43/35 |
| | | | 257/329 |
| 2015/0278420 A1* | 10/2015 | Ke | H01L 29/6681 |
| | | | 716/124 |
| 2015/0287746 A1* | 10/2015 | Shinkawata | H01L 21/7624 |
| | | | 257/347 |
| 2017/0084346 A1* | 3/2017 | Yang | G11C 13/0023 |
| 2017/0365675 A1* | 12/2017 | Chang | H01L 21/32139 |
| 2018/0004882 A1* | 1/2018 | Hsieh | G06F 30/392 |
| 2019/0074272 A1* | 3/2019 | Chu | H01L 21/823431 |
| 2019/0164979 A1 | 5/2019 | Hishida et al. | |
| 2020/0075616 A1 | 3/2020 | Hashimoto et al. | |
| 2020/0091069 A1 | 3/2020 | Umezawa | |
| 2020/0098440 A1* | 3/2020 | Chuang | G11C 17/165 |
| 2020/0286910 A1 | 9/2020 | Kashima | |
| 2020/0294585 A1* | 9/2020 | Nakazawa | H10N 70/245 |

FOREIGN PATENT DOCUMENTS

| | | |
|---|---|---|
| TW | 202011492 A | 3/2020 |
| TW | 202034516 A | 9/2020 |

\* cited by examiner

SEMICONDUCTOR STORAGE DEVICE

CROSS-REFERENCE TO RELATED APPLICATION(S)

This application is based upon and claims the benefit of priority from Japanese Patent Application No. 2020-156749, filed on Sep. 17, 2020, the entire contents of which are incorporated herein by reference.

FIELD

Embodiments described herein relate generally to semiconductor storage devices.

BACKGROUND

A semiconductor storage device generally includes a plurality of first wirings extending in a first direction and arranged side by side in a second direction intersecting with the first direction. The semiconductor storage device generally includes a plurality of second wirings extending in the second direction and arranged side by side in the first direction to intersect with the plurality of first wirings, respectively. The semiconductor storage device generally includes a plurality of memory cells provided at the intersections of the plurality of first wirings and the plurality of second wirings.

DETAILED DESCRIPTION

Figure 1:
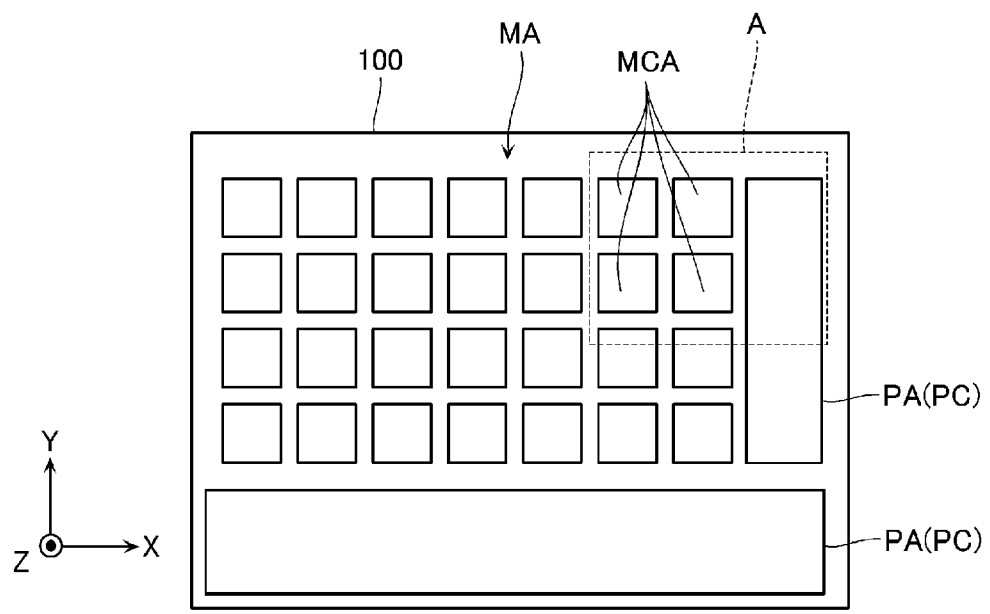
FIG. 1 is a schematic plan view illustrating a configuration of a semiconductor storage device according to a first embodiment.

Embodiments provide a semiconductor storage device which may be suitably manufactured.

In general, according to one embodiment, a semiconductor storage device includes a first region including a plurality of memory cells, a second region including a contact, and a third region adjacent to at least one of the first region and the second region. The first region includes a plurality of first wirings extending in a first direction and arranged side by side in a second direction intersecting with the first direction, a plurality of second wirings extending in the second direction and arranged side by side in the first direction to intersect with the plurality of first wirings, respectively, and the plurality of memory cells provided at intersections of the plurality of first wirings and the plurality of second wirings. The contact extends in a third direction intersecting with both the first direction and the second direction. The third region includes a plurality of first dummy wirings extending in the first direction and arranged side by side in the second direction and a plurality of second dummy wirings extending in the second direction and arranged side by side in the first direction to intersect with the plurality of first dummy wirings, respectively. A width in the first direction of a first one of the second dummy wirings, closest to the first region or the second region in the first direction, is equal to or less than a width in the first direction of a second one of the second dummy wirings next closest to the first region or the second region in the first direction.

In general, according to another embodiment, a semiconductor storage device includes a first region including a memory cell, a second region including a contact, and a third region adjacent to at least one of the first region and the second region. The first region includes a first wiring extending in a first direction, a second wiring extending in a second direction intersecting with the first direction to intersect with the first wiring, and the memory cell provided at an intersection of the first wiring and the second wiring. The second region includes the contact extending in a third direction intersecting with both the first direction and the second direction. The third region includes a first dummy wiring arranged side by side with the first wiring or the contact in the first direction and extending in the first direction, a second dummy wiring extending in the second direction to intersect with the first dummy wiring, a third dummy wiring extending in the first direction to intersect with the second dummy wiring, and a fourth dummy wiring arranged side by side with the second wiring or the contact and extending in the second direction to intersect with the third dummy wiring.

Next, a semiconductor storage device according to an embodiment will be described in detail with reference to the drawings. Furthermore, the following embodiment is merely an example, and is not intended to limit the present disclosure.

Further, in the present specification, a predetermined direction parallel to the surface of a substrate is referred to as the X direction, a direction parallel to the surface of the substrate and perpendicular to the X direction is referred to as the Y direction, and a direction perpendicular to the surface of the substrate is referred to as the Z direction.

Further, in the present specification, in some cases, a direction along a predetermined surface is referred to as a first direction, a direction intersecting with the first direction along the predetermined surface is referred to as a second direction, and a direction intersecting with the predetermined surface is referred to as a third direction. The first direction, the second direction, and the third direction may or may not correspond to any of the X direction, the Y direction, and the Z direction.

Further, in the present specification, expressions such as "upward" and "downward" are on the basis of the substrate. For example, when the first direction intersects with the surface of the substrate, a direction farther away from the substrate along the first direction is referred to as "upward", and a direction closer to the substrate along the first direction is referred to as "downward". Further, when referring to a lower surface or a lower end for a certain component, it means a surface or an end of this component on the substrate side, and when referring to an upper surface or an upper end of a certain component, it means a surface or an end of this component opposite to the substrate. Further, a surface intersecting with the second direction or the third direction is referred to as a side surface.

Hereinafter, a circuit configuration of a semiconductor storage device according to an embodiment will be described with reference to the drawings. Furthermore, the following drawings are schematic, and a partial configuration may be omitted for convenience of explanation.

First Embodiment

[Configuration]

Figure 2:
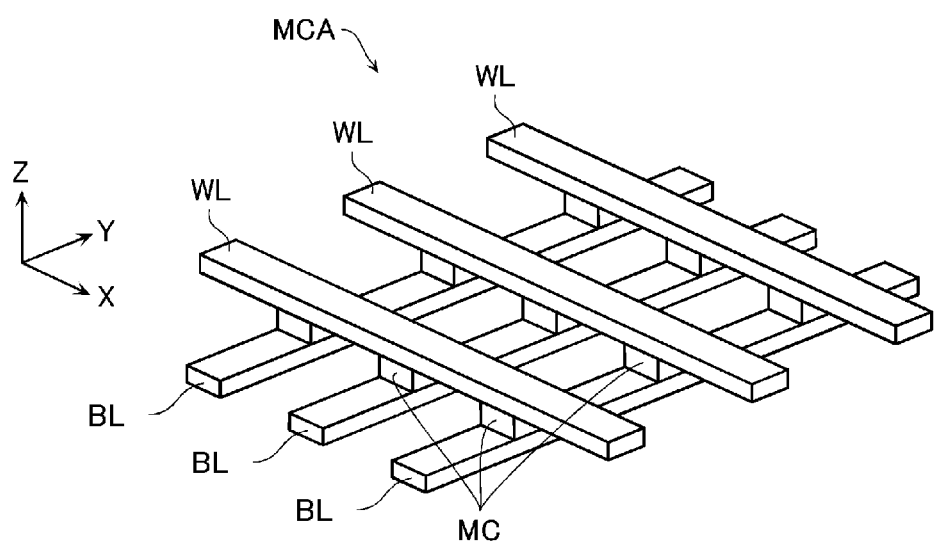
FIG. 2 is a schematic perspective view illustrating a configuration of a part of the semiconductor storage device.

First, a semiconductor storage device according to a first embodiment will be briefly described with reference to FIGS. 1 and 2. FIG. 1 is a schematic plan view illustrating a configuration of the semiconductor storage device according to the present embodiment. FIG. 2 is a schematic perspective view illustrating a configuration of a part of the same semiconductor storage device.

The semiconductor storage device according to the present embodiment includes a substrate 100. The substrate 100 includes a memory area MA and a peripheral area PA. A plurality of memory cell arrays MCA are provided side by side in the memory area MA in a matrix in the X direction and the Y direction. A peripheral circuit PC is provided in the peripheral area PA.

In the memory cell array MCA, for example, as illustrated in FIG. 2, a plurality of memory cells MC are provided side by side in a matrix in the X direction and the Y direction. The memory cell MC includes a variable resistance element VR (FIGS. 4 and 5) and a nonlinear element NO (FIGS. 4 and 5) to be described later. The memory cell MC functions as a storage element that stores data of 0 or 1.

The plurality of memory cells MC are connected respectively to a plurality of word lines WL arranged side by side in the Y direction and extending in the X direction and a plurality of bit lines BL arranged side by side in the X direction and extending in the Y direction.

The peripheral circuit PC is connected to the bit lines BL and the word lines WL via contacts and wirings. For example, the peripheral circuit PC includes a step-down circuit that steps down a power supply voltage to output the voltage to a voltage supply line, a high-speed I/F, an e-Fuse, an ASIC, and the like.

Next, a configuration of the semiconductor storage device according to the present embodiment will be described in more detail with reference to FIGS. 3 to 8.

Figure 3:
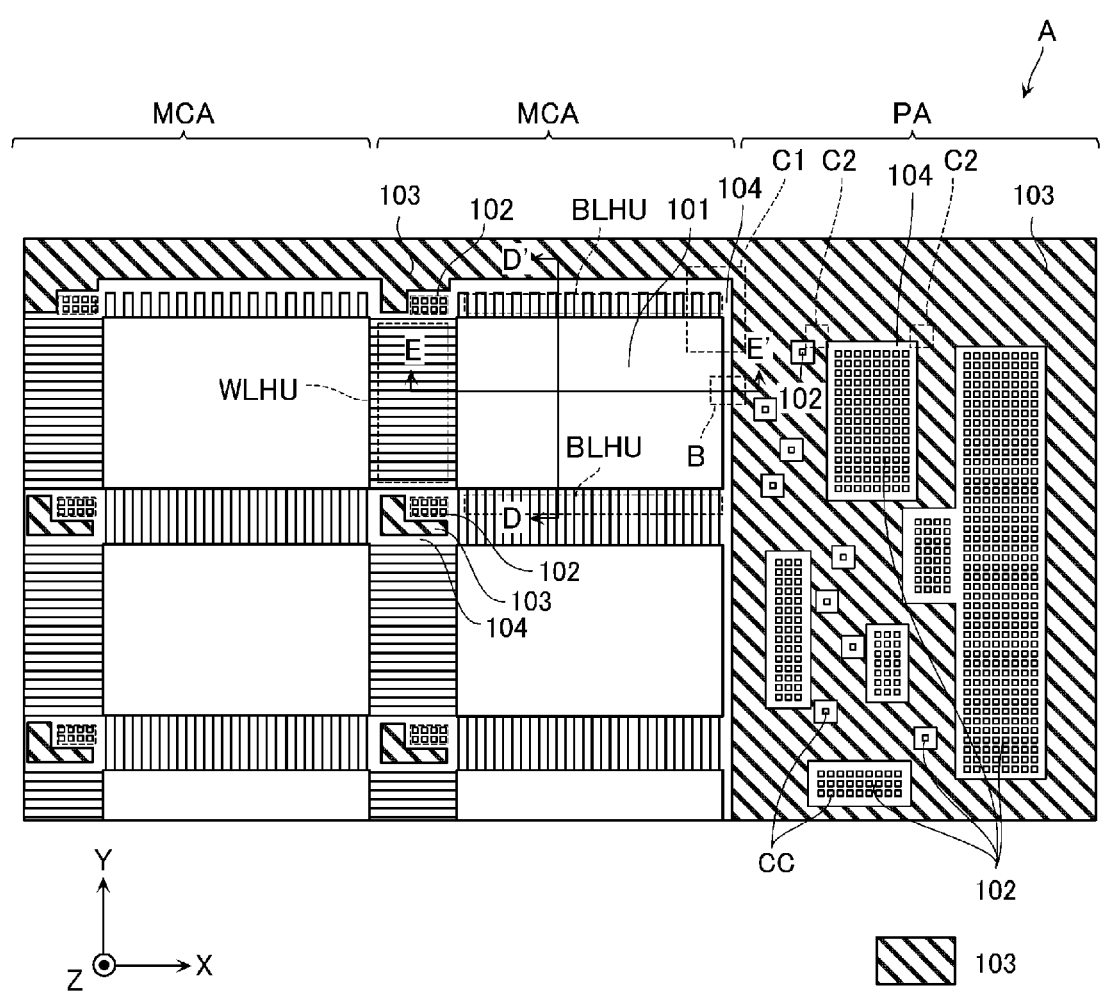
FIG. 3 is a schematic enlarged view of the portion indicated by A in FIG. 1.
Figure 4:
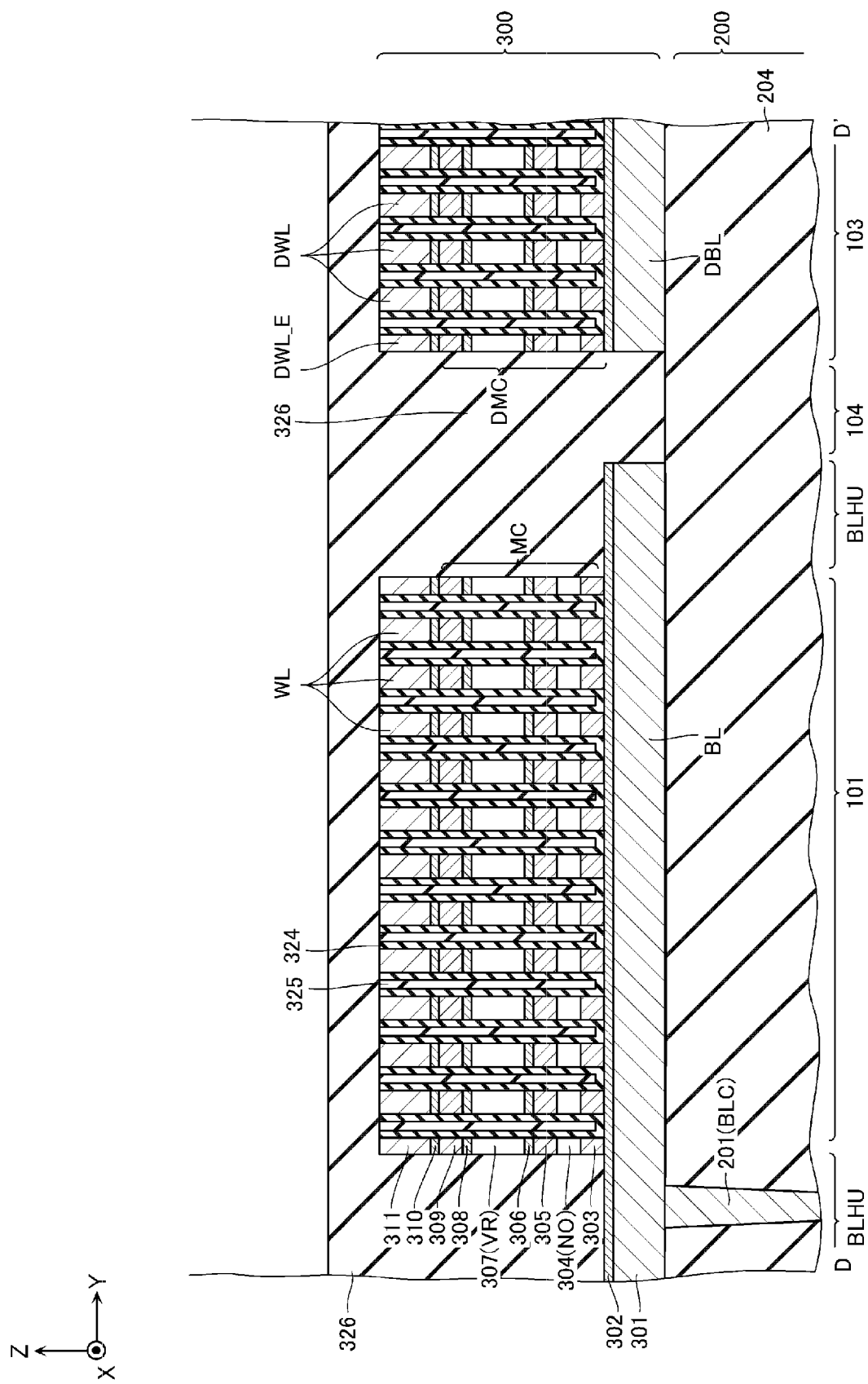
FIG. 4 is a schematic cross-sectional view of the structure illustrated in FIG. 3 taken along line D-D' and viewed in the direction of the arrow.
Figure 5:
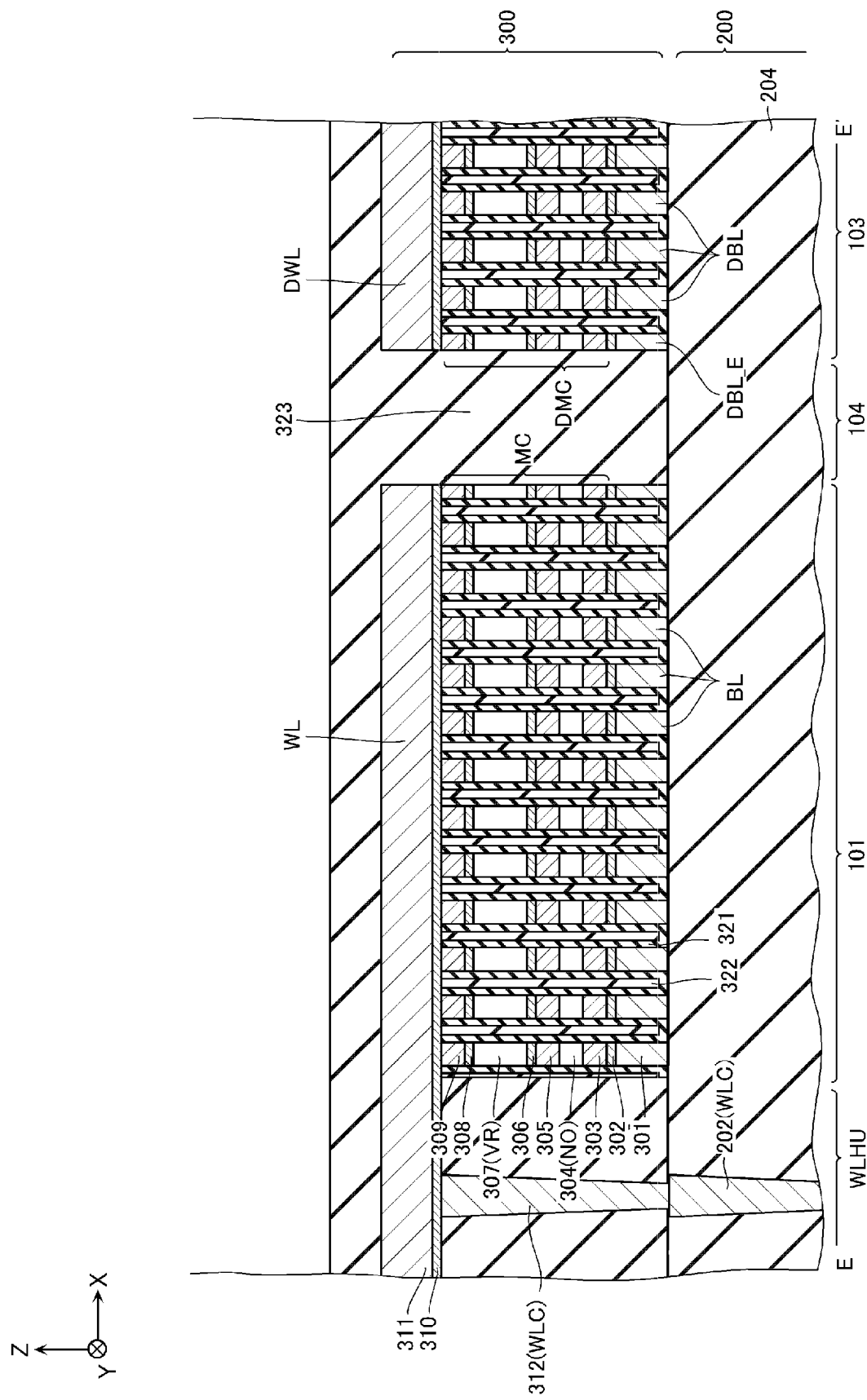
FIG. 5 is a schematic cross-sectional view of the structure illustrated in FIG. 3 taken along line E-E' and viewed in the direction of the arrow.

FIG. 3 is a schematic enlarged view of the portion indicated by A in FIG. 1. FIG. 4 is a schematic cross-sectional view of the structure illustrated in FIG. 3 taken along line D-D' and viewed in the direction of the arrow. FIG. 5 is a schematic cross-sectional view of the structure illustrated in FIG. 3 taken along line E-E' and viewed in the direction of the arrow.

The memory cell array MCA, as illustrated in FIG. 3, includes a region 101 (of a substrate) in which the plurality of memory cells MC are provided, a region WLHU (of a substrate) adjacent to the region 101 in the X direction, and a region BLHU (of a substrate) adjacent to the region 101 in the Y direction. Further, the memory cell array MCA includes a region 102 (of a substrate) in which a contact CC is formed, a region 103 (of a substrate) in which a dummy pattern is formed, and a region 104 (of a substrate) which separates a component in the region 102 and a component in the region 103 from a component in the other regions. The regions 102, 103, and 104 are provided at positions adjacent to the region WLHU in the Y direction and adjacent to the region BLHU in the X direction.

The peripheral area PA includes the region 102 in which the contact CC is formed, the region 103 in which the dummy pattern is formed, and the region 104 which separates the component in the region 102 and the component in the region 103 from the component in the other regions.

As illustrated in FIGS. 4 and 5, the region 101 includes the plurality of word lines WL extending in the X direction and arranged side by side in the Y direction, the plurality of bit lines BL extending in the Y direction and arranged side by side in the X direction to intersect with the plurality of word lines WL, respectively, and the plurality of memory cells MC provided respectively at the intersections of the plurality of word lines WL and the plurality of bit lines BL. These memory cells MC are electrically connected to the peripheral circuit PC.

The region BLHU is provided with a part of the bit line BL and a bit line contact BLC (FIG. 4) connected to the bit line BL. The bit line contact BLC extends in the Z direction and functions as a connection wiring that electrically connects the bit line BL and the peripheral circuit PC to each other.

The region WLHU is provided with a part of the word line WL and a word line contact WLC (FIG. 5) connected to the word line WL. The word line contact WLC extends in the Z direction and functions as a connection wiring that electrically connects the word wire WL and the peripheral circuit PC to each other.

As illustrated in FIG. 3, the region 102 includes one or a plurality of contacts CC. The contact CC extends in the Z direction and functions as a connection wiring between the peripheral circuit PC and an external control circuit board (not illustrated). The contact CC includes, for example, a stacked film of titanium nitride (TiN) and tungsten (W).

As illustrated in FIGS. 4 and 5, the region 103 includes a plurality of dummy word lines DWL extending in the X direction and arranged side by side in the Y direction, a plurality of dummy bit lines DBL extending in the Y direction and arranged side by side in the X direction to intersect with the plurality of dummy word lines DWL, and a plurality of dummy memory cells DMC provided respectively at the intersections of the plurality of dummy word lines DWL and the plurality of dummy bit lines DBL. Furthermore, the plurality of dummy word lines DWL, the plurality of dummy bit lines DBL, and the plurality of dummy memory cells DMC are not electrically connected to the peripheral circuit PC.

The plurality of dummy word lines DWL, the plurality of dummy bit lines DBL, and the plurality of dummy memory cells DMC are provided as a part of the dummy pattern. Such a dummy pattern has a function of preventing a large difference in processing characteristics between a high density region and a low density region of a pattern on a target processing surface in a semiconductor manufacturing process. The region 103 according to the present embodiment is provided, for example, as a region having the same degree of density as that of the region 101 which occupies a large region of the target processing surface.

Further, as illustrated in FIG. 3, the region 103 has an irregular shape arranged so as to avoid the region 101 and the region 102. Furthermore, the irregular shape referred to here means that any other shape than a rectangular shape. For example, when the region 103 has a rectangular shape, the wiring lengths in the X direction of the plurality of dummy word lines DWL included in the region 103 are all the same. Further, the positions in the X direction of both ends of the plurality of dummy word lines DWL in the X direction are all the same. Similarly, when the region 103 has a rectangular shape, the wiring lengths in the Y direction of the plurality of dummy bit lines DBL included in the region 103 are all the same. Further, the positions in the Y direction of both ends of the plurality of dummy bit lines DBL in the Y direction are all the same. Further, all of these dummy word lines DWL and the dummy bit lines DBL intersect each other, and all of the dummy memory cells DMC are provided at the intersections thereof. Meanwhile, when the region 103 has an irregular shape, the wiring lengths in the X direction of the plurality of dummy word lines DWL and the wiring lengths in the Y direction of the plurality of dummy bit lines DBL included in the region 103 are not all the same. Further, when the region 103 has an irregular shape, the position in the X direction of at least one of both the ends of the plurality of dummy word lines DWL in the X direction may not match between the plurality of dummy word lines DWL. Further, when the region 103 has an irregular shape, the position in the Y direction of at least one of both the ends of the plurality of dummy bit lines DBL in the Y direction may not match between the plurality of dummy bit lines DBL. Further, at least a part of the plurality of dummy word lines DWL may not intersect with at least a part of the plurality of dummy bit lines DBL.

As illustrated in FIGS. 4 and 5, the region 104 includes an insulating layer 323 or an insulating layer 326. The region 104 has a function of separating and insulating the region 101 and the region 103 from each other and the region 102 and the region 103 from each other, respectively.

Next, the structures provided so as to be stacked in the Z direction in the regions 101 to 104, the region WLHU, and the region BLHU, will be described in detail.

As illustrated in FIGS. 4 and 5, the semiconductor storage device according to the present embodiment includes a wiring layer 200 and a memory layer 300 provided on the wiring layer 200.

The wiring layer 200 includes a contact wiring 201 (FIG. 4) extending in the Z direction, a contact wiring 202 (FIG. 5) extending in the Z direction, and an insulating layer 204 such as silicon oxide (SiO$_2$) provided therebetween.

The contact wiring 201 (FIG. 4) provided in the region BLHU functions as the bit line contact BLC. The contact wiring 201 includes, for example, a stacked film of titanium nitride (TiN) and tungsten (W).

The contact wiring 202 (FIG. 5) provided in the region WLHU functions as the word line contact WLC. The contact wiring 202 includes, for example, a stacked film of titanium nitride (TiN) and tungsten (W).

As illustrated in FIGS. 4 and 5, for example, the regions 101 and 103 of the memory layer 300 include a conductive layer 301, a barrier conductive layer 302, an electrode layer 303, a chalcogen layer 304, an electrode layer 305, a barrier conductive layer 306, a chalcogen layer 307, a barrier conductive layer 308, an electrode layer 309, a barrier conductive layer 310, and a conductive layer 311.

The conductive layer 301 is provided on the upper surface of the insulating layer 204, for example, as illustrated in the drawings. The conductive layer 301 extends in the Y direction and functions as a part of the bit line BL or the dummy bit line DBL. The conductive layer 301 contains, for example, tungsten (W).

The barrier conductive layer 302 is provided on the upper surface of the conductive layer 301. The barrier conductive layer 302 extends in the Y direction and functions as a part of the bit line BL or the dummy bit line DBL. The barrier conductive layer 302 contains, for example, tungsten nitride (WN).

The electrode layer 303 is provided on the upper surface of the barrier conductive layer 302. The electrode layer 303 functions as a cathode of the memory cell MC or a part of the dummy memory cell DMC. The electrode layer 303 contains, for example, carbon nitride (CN).

The chalcogen layer 304 is provided on the upper surface of the electrode layer 303. The chalcogen layer 304 functions as a part of the nonlinear element NO or the dummy memory cell DMC. For example, when a voltage lower than a predetermined threshold value is applied to the chalcogen layer 304, the chalcogen layer 304 is in a high resistance state. When the voltage applied to the chalcogen layer 304 reaches the predetermined threshold value, the chalcogen layer 304 reaches a low resistance state, and the current flowing through the chalcogen layer 304 increases by a plurality of orders of magnitude. When the voltage applied to the chalcogen layer 304 falls below a predetermined voltage for a certain period of time, the chalcogen layer 304 reaches the high resistance state again.

The chalcogen layer 304 contains, for example, at least one chalcogen. The chalcogen layer 304 may include, for example, a chalcogenide that is a compound containing a chalcogen. Further, the chalcogen layer 304 may contain at least one element selected from the group consisting of B, Al, Ga, In, C, Si, Ge, Sn, As, P and Sb.

Furthermore, the chalcogen referred to here is an element belonging to group 16 of the periodic table, excluding oxygen (O). Chalcogens include, for example, sulfur (S), selenium (Se), tellurium (Te), and the like.

The electrode layer 305 is provided on the upper surface of the chalcogen layer 304. The electrode layer 305 functions as an electrode connected to the variable resistance element VR and the nonlinear element NO, or a part of the dummy memory cell DMC. The electrode layer 305 contains, for example, carbon (C).

The barrier conductive layer 306 is provided on the upper surface of the electrode layer 305. The barrier conductive layer 306 contains, for example, tungsten nitride (WN).

The chalcogen layer 307 is provided on the upper surface of the barrier conductive layer 306. The chalcogen layer 307 functions as a part of the variable resistance element VR or the dummy memory cell DMC. The chalcogen layer 307 includes, for example, a crystal region and a phase change region. The phase change region becomes an amorphous state (reset state: high resistance state) by heating above the melting temperature and rapid cooling. Further, the phase change region becomes a crystal state (set state: low resistance state) due to overheating at a temperature lower than the melting temperature and higher than the crystallization temperature and gentle cooling.

The chalcogen layer 307 contains, for example, at least one chalcogen. The chalcogen layer 307 may include, for example, a chalcogenide that is a compound containing a chalcogen. The chalcogen layer 307 may be, for example, GeSbTe, GeTe, SbTe, SiTe, or the like. Further, the chalcogen layer 307 may include at least one element selected from among germanium (Ge), antimony (Sb), and tellurium (Te).

The barrier conductive layer 308 is provided on the upper surface of the chalcogen layer 307. The barrier conductive layer 308 contains, for example, tungsten nitride (WN).

The electrode layer 309 is provided on the upper surface of the barrier conductive layer 308. The electrode layer 309 functions as an anode of the memory cell MC or a part of the dummy memory cell DMC. The electrode layer 309 contains, for example, carbon (C).

The barrier conductive layer 310 is provided on the upper surface of the electrode layer 309. The barrier conductive layer 310 extends in the X direction and functions as a part of the word line WL or the dummy word line DWL. The barrier conductive layer 310 contains, for example, tungsten nitride (WN).

The conductive layer 311 is provided on the upper surface of the barrier conductive layer 310. The conductive layer 311 extends in the X direction and functions as a part of the word line WL or the dummy word line DWL. The conductive layer 311 contains, for example, tungsten (W).

The contact wiring 312 (FIG. 5) is provided in the region WLHU. The contact wiring 312 extends in the Z direction and is connected to the lower surface of the barrier conductive layer 310 which functions as part of the word line WL and to the upper surface of the contact wiring 202. The contact wiring 312 functions as a part of the word line contact WLC connected to the word line WL. The contact wiring 312 includes, for example, tungsten (W).

Furthermore, for example, as illustrated in FIG. 4, on the side surfaces in the Y direction of a component in the region 101 and of a component in the region 103 of the memory layer 300, a barrier insulating layer 324 and an insulating layer 325 provided between these components are provided. Further, in the region 104 of the memory layer 300, an insulating layer 326 is provided at a height position corresponding to the bit line BL and the memory cell MC. The barrier insulating layer 324 contains silicon nitride (SiN). The insulating layer 325 contains, for example, carbon containing silicon oxide (SiOC). The insulating layer 326 contains, for example, silicon oxide ($SiO_2$).

Further, for example, as illustrated in FIG. 5, on the side surfaces in the X direction of the component in the region 101 and of the component in the region 103 of the memory layer 300, a barrier insulating layer 321 and an insulating layer 322 provided between these components are provided. Further, in the region 104 of the memory layer 300, an insulating layer 323 is provided at a height position corresponding to the bit line BL, the memory cell MC, and the word line WL. The barrier insulating layer 321 contains silicon nitride (SiN). The insulating layer 322 contains, for example, carbon containing silicon oxide (SiOC). The insulating layer 323 contains, for example, silicon oxide ($SiO_2$).

Next, a part of the region 101 and the region 103 and a part of the region 102 and the region 103 will be described in detail with reference to FIGS. 6 to 8.

Figure 6:
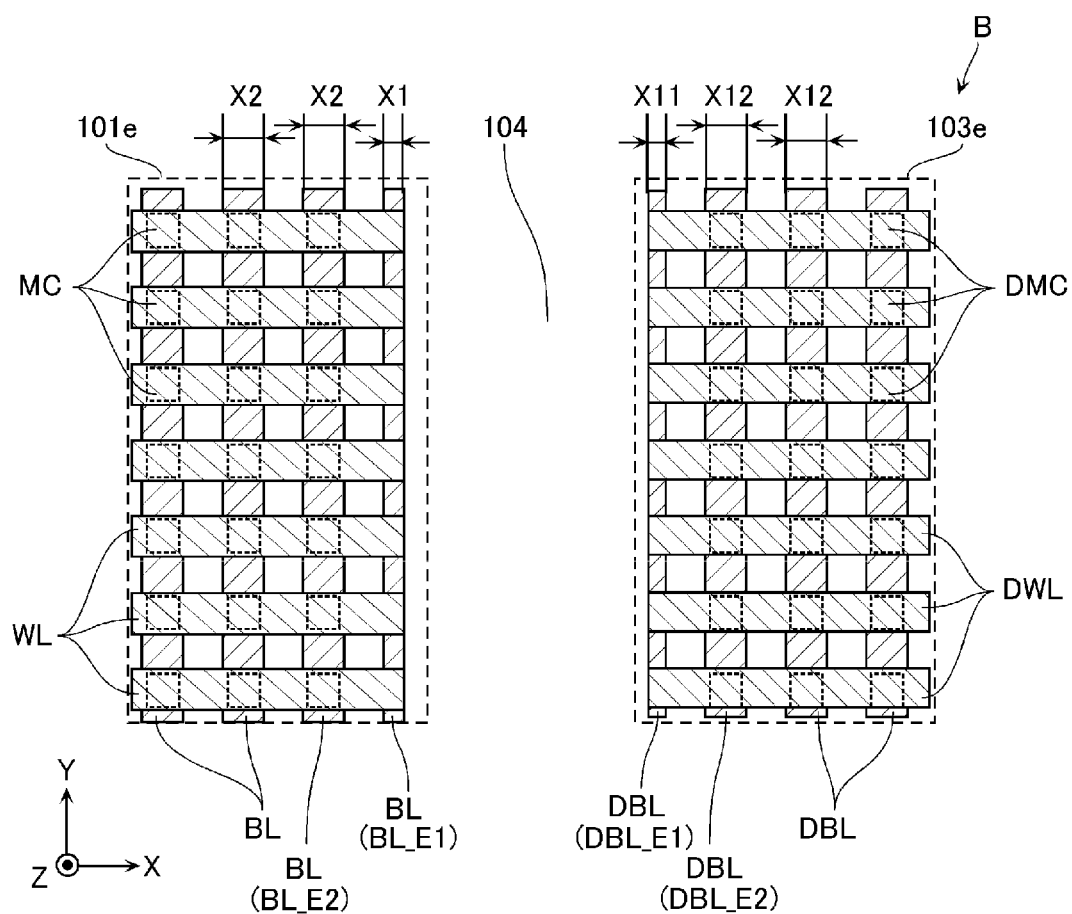
FIG. 6 is a schematic enlarged view of the portion indicated by B in FIG. 3.

FIG. 6 is a schematic enlarged view of the portion indicated by B in FIG. 3, illustrating the portion where the region 101 and the region 103 are adjacent to each other in the X direction.

The left portion of FIG. 6 illustrates a region 101e. The region 101e is a part of the region 101. The region 101e is adjacent to the region 103 via the region 104 in the X direction. Furthermore, the region 101e includes a bit line BL_E1 closest to a region 103e in the X direction and a bit line BL_E2 second closest to the region 103e in the X direction among the plurality of bit lines BL.

Among the plurality of bit lines BL, the width in the X direction of the bit line BL other than the bit line BL_E1 is approximately the same as the width X2 in the X direction of the bit line BL_E2. The width X1 in the X direction of the bit line BL_E1 is equal to or less than the width X2. That is, the width X1 may be equal to the width X2, or may be smaller than the width X2.

The right portion of FIG. 6 illustrates the region 103e. The region 103e is a part of the region 103. The region 103e is adjacent to the region 101 via the region 104 in the X direction. Further, the region 103e includes a dummy bit line DBL_E1 closest to the region 101e in the X direction and a dummy bit line DBL_E2 second closest to the region 101e in the X direction among the plurality of dummy bit lines DBL.

Among the plurality of dummy bit lines DBL, the width in the X direction of the dummy bit line DBL other than the dummy bit line DBL_E1 is approximately the same as the width X12 in the X direction of the dummy bit line DBL_E2. The width X11 in the X direction of the dummy bit line DBL_E1 is equal to or less than the width X12.

Figure 7:
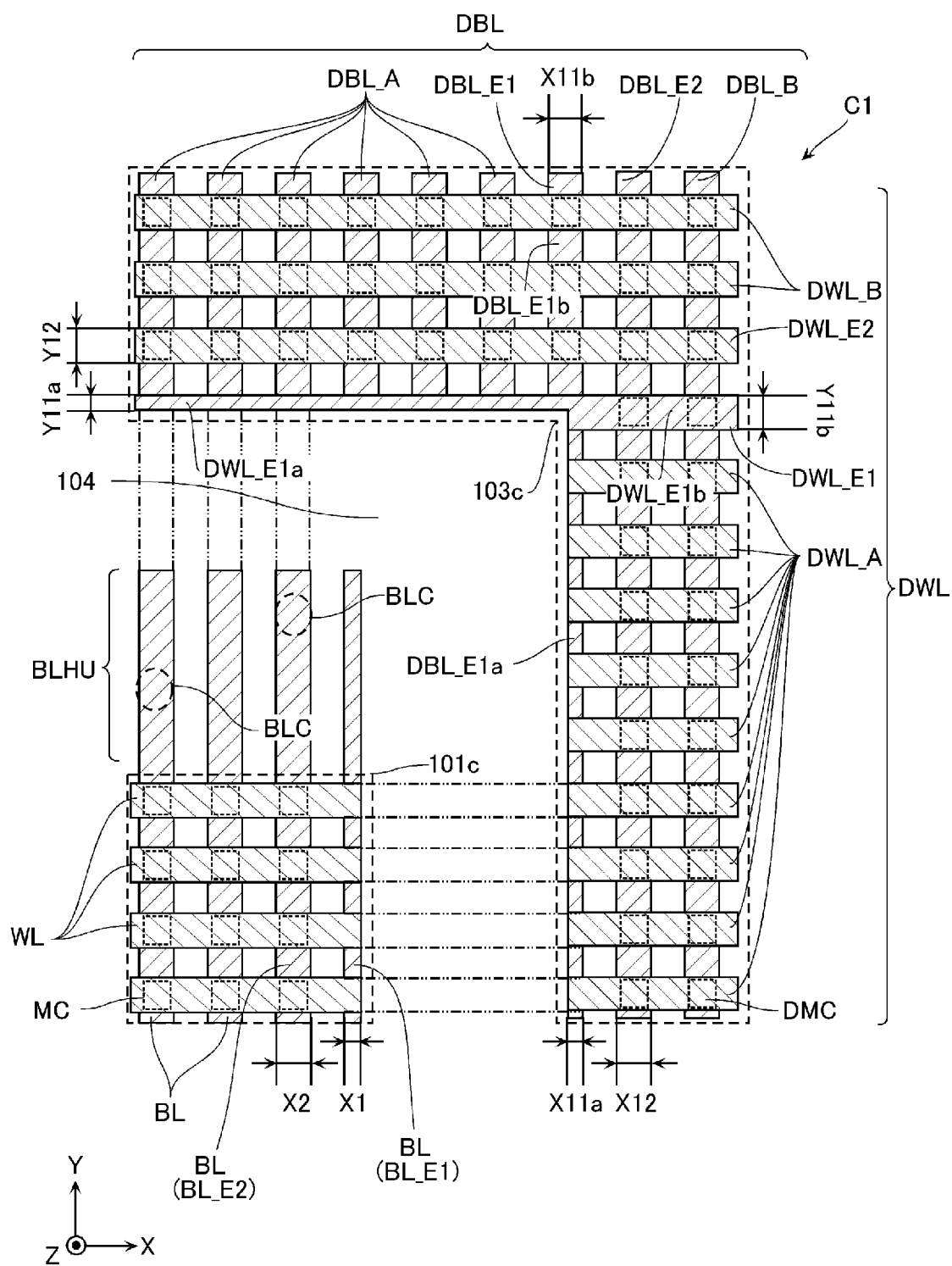
FIG. 7 is a schematic enlarged view of the portion indicated by C1 in FIG. 3.

FIG. 7 is a schematic enlarged view of the portion indicated by C1 in FIG. 3, illustrating the portion where the region 101 and the region 103 are adjacent to each other in the X direction and the Y direction.

The left lower portion of FIG. 7 illustrates a region 101c. The region 101c is a part of the region 101. The region 101c is adjacent to the region 103 via the region 104 in the X direction. Further, the region 101c is adjacent to the region 103 via the region 104 and the region BLHU in the Y direction. Furthermore, the region 101c includes the bit line BL_E1 closest to the region 103 and the bit line BL_E2 second closest to the region 103 in the X direction, similarly to the region 101e.

The left upper portion, the right upper portion, and the right lower portion of FIG. 7 illustrate a region 103c. The region 103c is a part of the region 103. In the region 103c, a portion illustrated in the right lower portion of FIG. 7 is adjacent to the region 101 via the region 104 in the X direction. Further, in the region 103c, a portion illustrated in the left upper portion of FIG. 7 is adjacent to the region 101 via the region 104 and the region BLHU in the Y direction.

The region 103c includes a plurality of dummy word lines DWL_A extending in the X direction in the right lower portion of FIG. 7 and a plurality of dummy word lines DWL_B extending in the X direction in the left upper portion and the right upper portion of FIG. 7.

One end in the X direction of the plurality of dummy word lines DWL_A is connected to the region 104. Further, at least a part of the plurality of dummy word lines DWL_A is provided apart from the word line WL in the region 101 via the region 104 in the X direction, and is provided on the extension of the word line WL.

The plurality of dummy word lines DWL_B include a dummy word line DWL_E1 closest to the region 101c in the Y direction and a dummy word line DWL_E2 second closest to the region 101c in the Y direction. The dummy word line DWL_E1 includes a portion DWL_E1a included in the left upper portion of FIG. 7 and a portion DWL_E1b included in the right upper portion of FIG. 7. The width in the Y direction of the plurality of dummy word lines DWL_B other than the dummy word line DWL_E1, the width in the Y direction of the portion DWL_E1b of the dummy word line DWL_E1, and the width in the Y direction of the plurality of dummy word lines DWL_A are approximately the same as the width Y12 in the Y direction of the dummy word line DWL_E2. The width Y11a in the Y direction of the portion DWL_E1a of the dummy word line DWL_E1 is equal to or less than the width Y11b in the Y direction of the portion DWL_E1b of the dummy word line DWL_E1 and the width Y12.

Further, the region 103c includes a plurality of dummy bit lines DBL_A extending in the Y direction in the left upper portion of FIG. 7 and a plurality of dummy bit lines DBL_B extending in the Y direction in the right lower portion and the right upper portion of FIG. 7.

One end in the Y direction of the plurality of dummy bit lines DBL_A is connected to the region 104. Further, at least a part of the plurality of dummy bit lines DBL_A is provided apart from the bit line BL in the region 101 via the region 104 in the Y direction, and is provided on the extension of the bit line BL.

The plurality of dummy bit lines DBL_B include a dummy bit line DBL_E1 closest to the region 101c in the X direction and a dummy bit line DBL_E2 second closest to the region 101c in the X direction. The dummy bit line DBL_E1 includes a portion DBL_E1a included in the right lower portion of FIG. 7 and a portion DBL_E1b included in the right upper portion of FIG. 7. The width in the X direction of the plurality of dummy bit lines DBL_B other than the dummy bit line DBL_E1, the width in the X direction of the portion DBL_E1b of the dummy bit line DBL_E1, and the width in the X direction of the plurality of dummy bit lines DBL_A are approximately the same as the width X12 in the X direction of the dummy bit line DBL_E2. The width X11a in the X direction of the portion DBL_E1a of the dummy bit line DBL_E1 is equal to or less than the width X11b in the X direction of the portion DBL_E1b of the dummy bit line DBL_E1 and the width X12.

Figure 8:
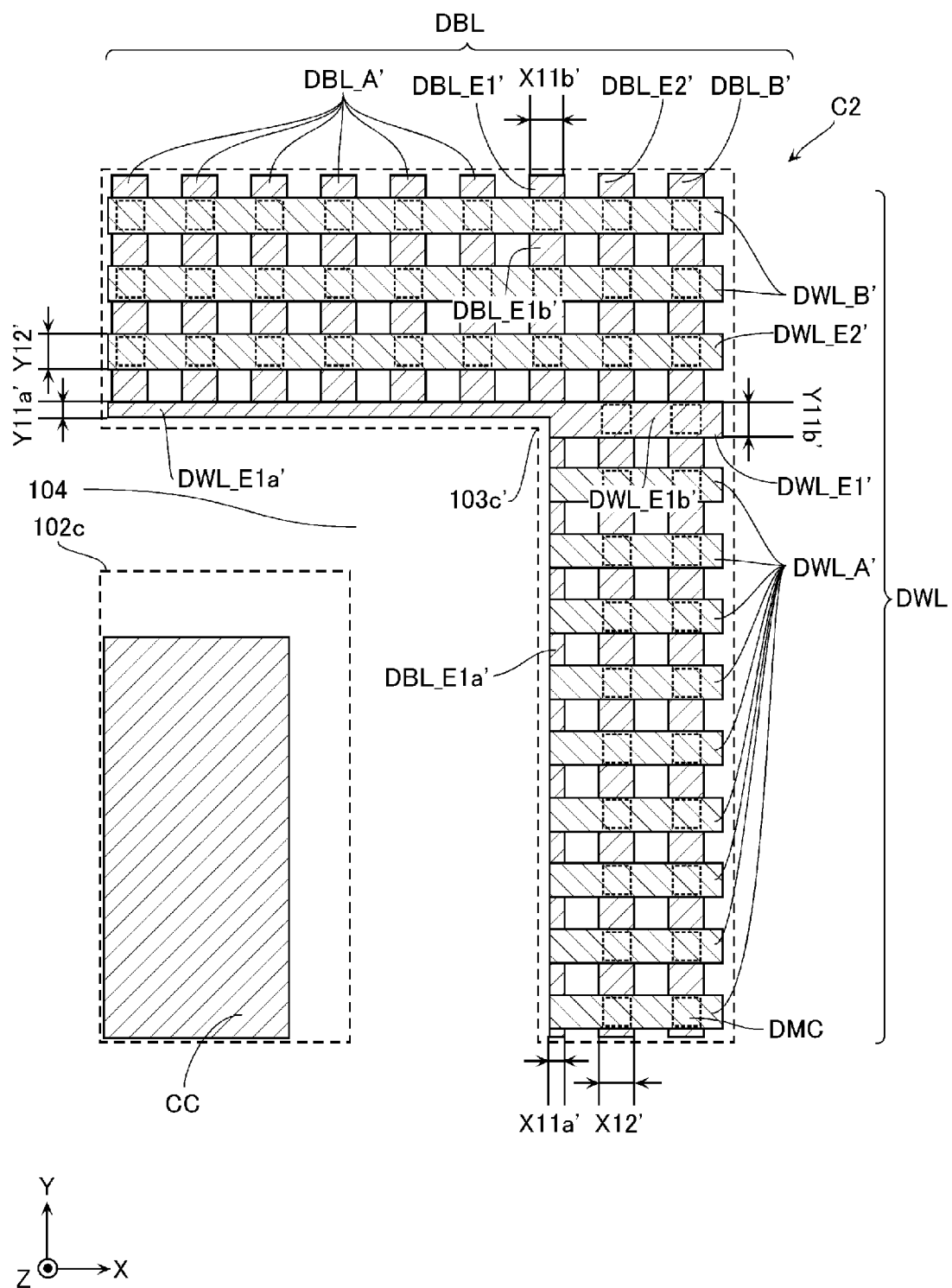
FIG. 8 is a schematic enlarged view of the portion indicated by C2 in FIG. 3.

FIG. 8 is a schematic enlarged view of the portion indicated by C2 in FIG. 3, illustrating the portion where the region 102 and the region 103 are adjacent to each other in the X direction and the Y direction.

The left lower portion of FIG. 8 illustrates a region 102c. The region 102c is a part of the region 102. The region 102c is adjacent to the region 103 via the region 104 in the X direction. Further, the region 102c is adjacent to the region 103 via the region 104 in the Y direction. Furthermore, the region 102c includes one or a plurality of contacts CC.

The left upper portion, the right upper portion, and the right lower portion of FIG. 8 illustrate a region 103c'. The region 103c' is a part of the region 103. In the region 103c', a portion illustrated in the right lower portion of FIG. 8 is adjacent to the region 102 via the region 104 in the X direction. Further, in the region 103c', a portion illustrated in the left upper portion of FIG. 8 is adjacent to the region 102 via the region 104 in the Y direction.

The region 103c' includes a plurality of dummy word lines DWL_A' extending in the X direction in the right lower portion of FIG. 8 and a plurality of dummy word lines DWL_B' extending in the X direction in the left upper portion and the right upper portion of FIG. 8.

One end in the X direction of the plurality of dummy word lines DWL_A' is connected to the region 104. Further, at least a part of the plurality of dummy word lines DWL_A' is provided apart from the contact CC in the region 102 via the region 104 in the X direction.

The plurality of dummy word lines DWL_B' include a dummy word line DWL_E1' closest to the region 102c in the Y direction and a dummy word line DWL_E2' second closest to the region 102c in the Y direction. The dummy word line DWL_E1' includes a portion DWL_E1a' included in the left upper portion of FIG. 8 and a portion DWL_E1b' included in the right upper portion of FIG. 8. The width in the Y direction of the plurality of dummy word lines DWL_B' other than the dummy word line DWL_E1', the width in the Y direction of the portion DWL_E1b' of the dummy word line DWL_E1', and the width in the Y direction of the plurality of dummy word lines DWL_A' are approximately the same as the width Y12' in the Y direction of the dummy word line DWL_E2'. The width Y11a' in the Y direction of the portion DWL_E1a' of the dummy word line DWL_E1' is equal to or less than the width Y11b' in the Y direction of the portion DWL_E1b' of the dummy word line DWL_E1' and the width Y12'.

Further, the region 103c' includes a plurality of dummy bit lines DBL_A' extending in the Y direction in the left upper portion of FIG. 8 and a plurality of dummy bit lines DBL_B' extending in the Y direction in the right lower portion and the right upper portion of FIG. 8.

One end in the Y direction of the plurality of dummy bit lines DBL_A' is connected to the region 104. Further, at least a part of the plurality of dummy bit lines DBL_A' is provided apart from the contact CC in the region 102 via the region 104 in the Y direction.

The plurality of dummy bit lines DBL_B' include a dummy bit line DBL_E1' closest to the region 102c in the X direction and a dummy word line DBL_E2' second closest to the region 102c in the X direction. The dummy bit line DBL_E1' includes a portion DBL_E1a' included in the right lower portion of FIG. 8 and a portion DBL_E1b' included in the right upper portion of FIG. 8. The width in the X direction of the plurality of dummy bit lines DBL_B' other than the dummy bit line DBL_E1', the width in the X direction of the portion DBL_E1b' of the dummy bit line DBL_E1', and the width in the X direction of the plurality of dummy bit lines DBL_A' are approximately the same as the width X12' in the X direction of the dummy bit line DBL_E2'. The width X11a' in the X direction of the portion DBL_E1a' of the dummy bit line DBL_E1' is equal to or less than the width X11b' in the X direction of the portion DBL_E1b' of the dummy bit line DBL_E1' and the width X12'.

[Manufacturing Method]

Next, a method of manufacturing the semiconductor storage device according to the present embodiment will be described with reference to FIGS. 9 to 30. FIG. 14, FIG. 18, FIG. 24, FIG. 28, and FIG. 30 are schematic plan views of the position corresponding to FIG. 3. FIGS. 21 to 23, FIGS. 25 to 27, and FIG. 29 are schematic cross-sectional views of the position corresponding to FIG. 4. FIGS. 9 to 13, FIGS. 15 to 17, and FIGS. 19 and 20 are schematic cross-sectional views of the position corresponding to FIG. 5. Furthermore, for convenience of explanation, a partial configuration is occasionally omitted in FIGS. 9 to 30.

In the manufacture of the semiconductor storage device according to the present embodiment, for example, the peripheral circuit PC (FIG. 1) is formed on a semiconductor wafer. Next, for example, the wiring layer 200 (FIG. 9) is formed to connect the peripheral circuit PC to the memory cell array MCA.

Figure 9:
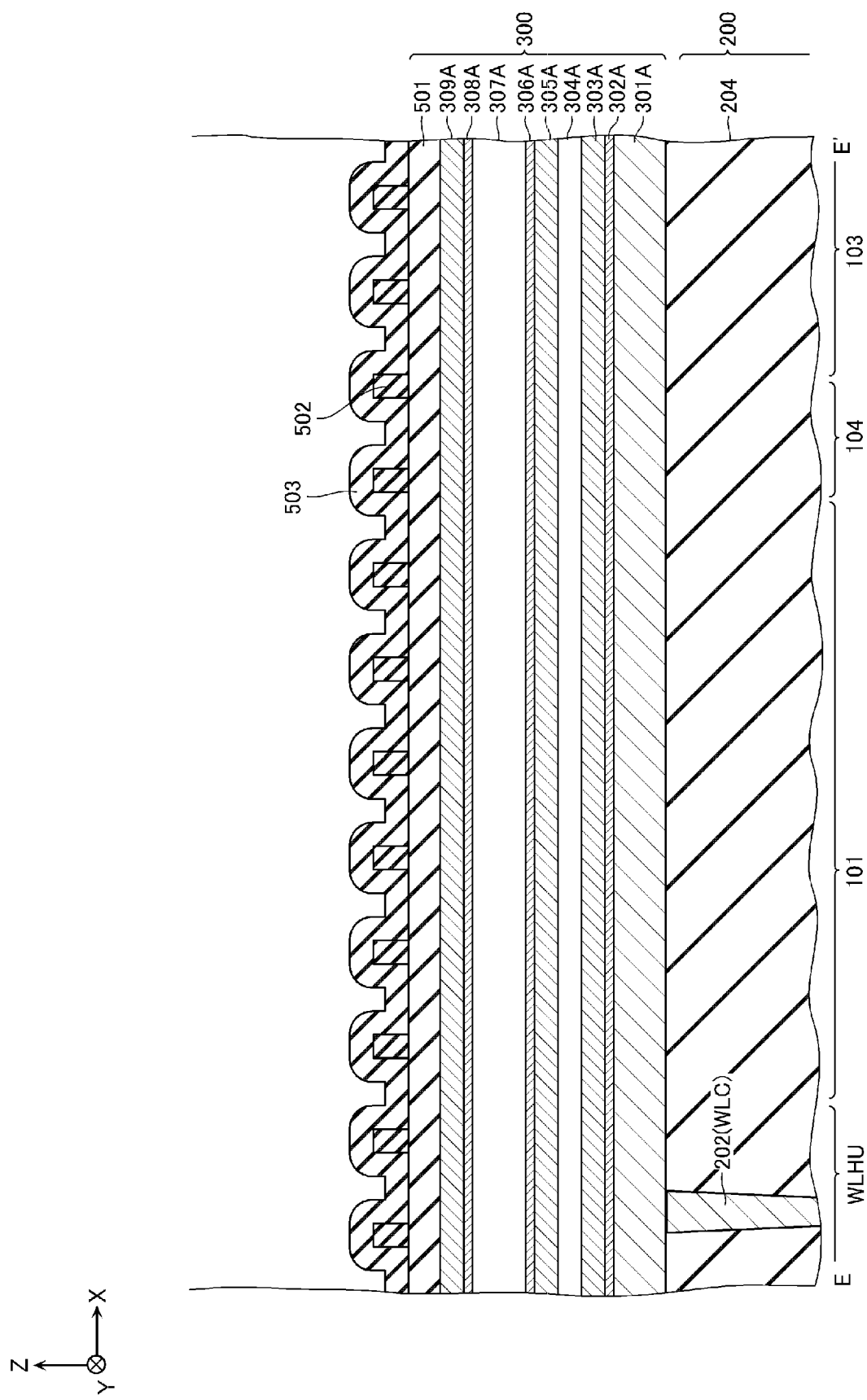
FIG. 9 is a schematic cross-sectional view illustrating a method of manufacturing the semiconductor storage device according to the first embodiment.

Next, for example, as illustrated in FIG. 9, a stacked body including a conductive layer 301A forming the conductive layer 301, a barrier conductive layer 302A forming the barrier conductive layer 302, an electrode layer 303A forming the electrode layer 303, a chalcogen layer 304A forming the chalcogen layer 304, an electrode layer 305A forming the electrode layer 305, a barrier conductive layer 306A forming the barrier conductive layer 306, a chalcogen layer (variable resistance layer) 307A forming the chalcogen layer 307, a barrier conductive layer 308A forming the barrier conductive layer 308, an electrode layer 309A forming the electrode layer 309, and a hard mask layer 501 such as silicon nitride (SiN) is formed on the upper surface of the wiring layer 200. This process is performed by, for example, physical vapor deposition (PVD) such as sputtering.

Next, for example, as illustrated in FIG. 9, a core material 502 such as carbon (C) is formed on the upper surface of the hard mask layer 501. The core material 502 is provided in all the regions including, for example, at least the region 101, the region 102, the region 103, and the region 104, and extends in the Y direction and is formed side by side in the X direction.

Next, for example, as illustrated in FIG. 9, a hard mask layer 503 such as silicon oxide (SiO$_2$) is formed on the upper surface of the hard mask layer 501 and on the side surface and the upper surface of the core material 502. This process is performed by, for example, CVD using a gas such as TEOS.

Figure 10:
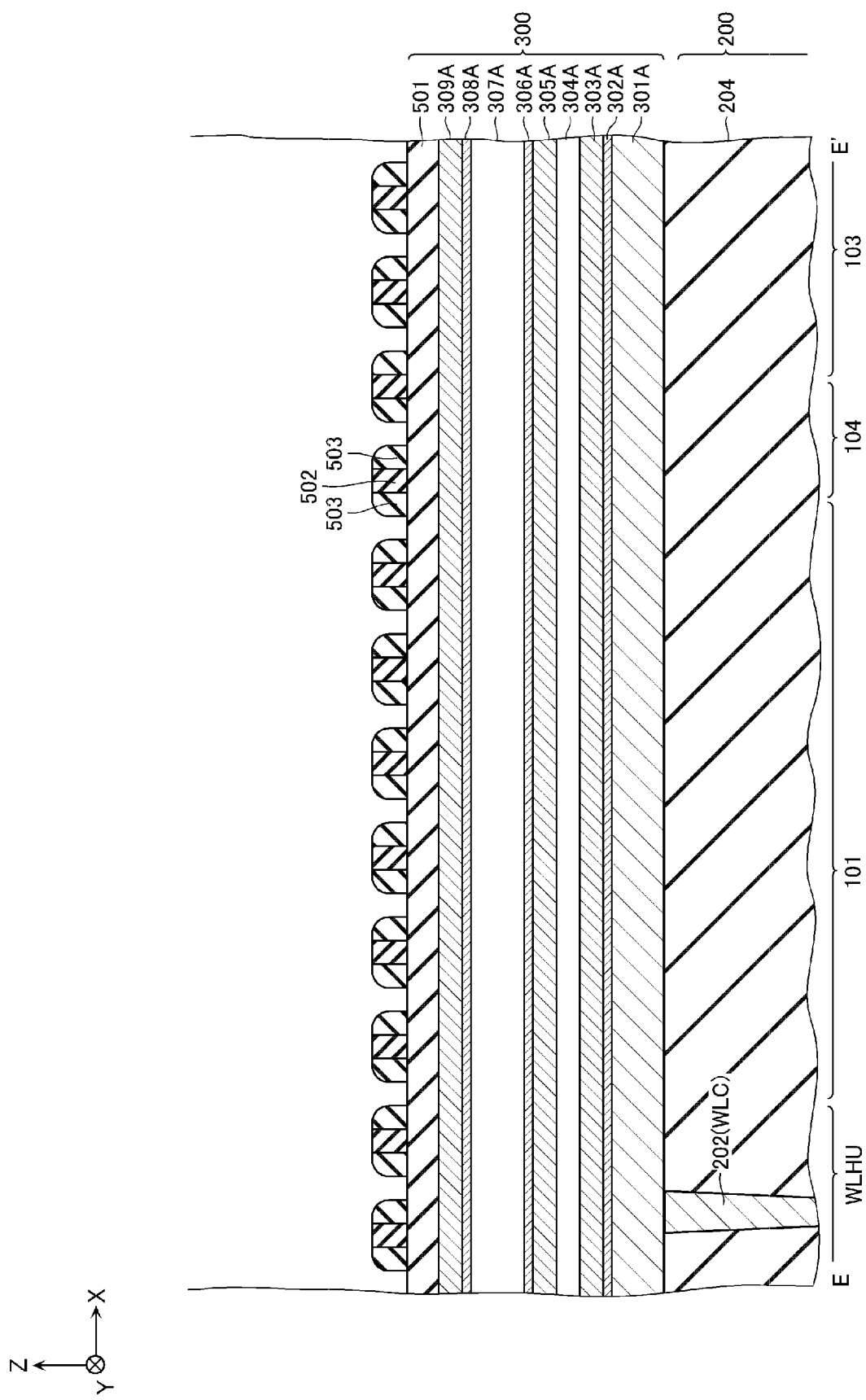
FIG. 10 is a schematic cross-sectional view illustrating the same manufacturing method.

Next, for example, as illustrated in FIG. 10, a portion of the hard mask layer 503 formed on the upper surfaces of the hard mask layer 501 and of the core material 502 is removed, while leaving a portion of the hard mask layer 503 formed on the side surface of the core material 502.

Figure 11:
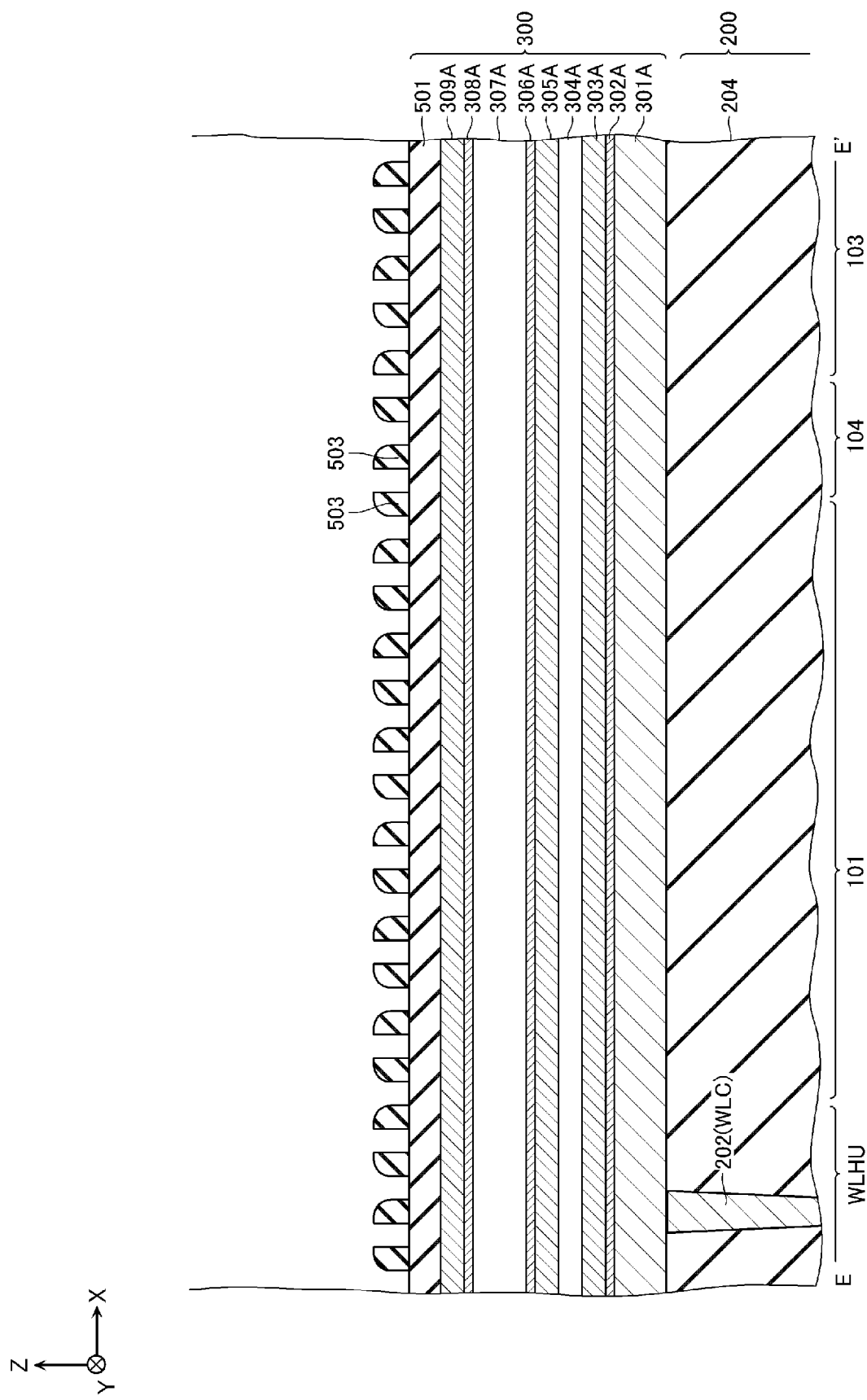
FIG. 11 is a schematic cross-sectional view illustrating the same manufacturing method.

Next, for example, as illustrated in FIG. 11, the core material 502 is removed. The removal of the core material 502 is performed by, for example, asking.

Figure 12:
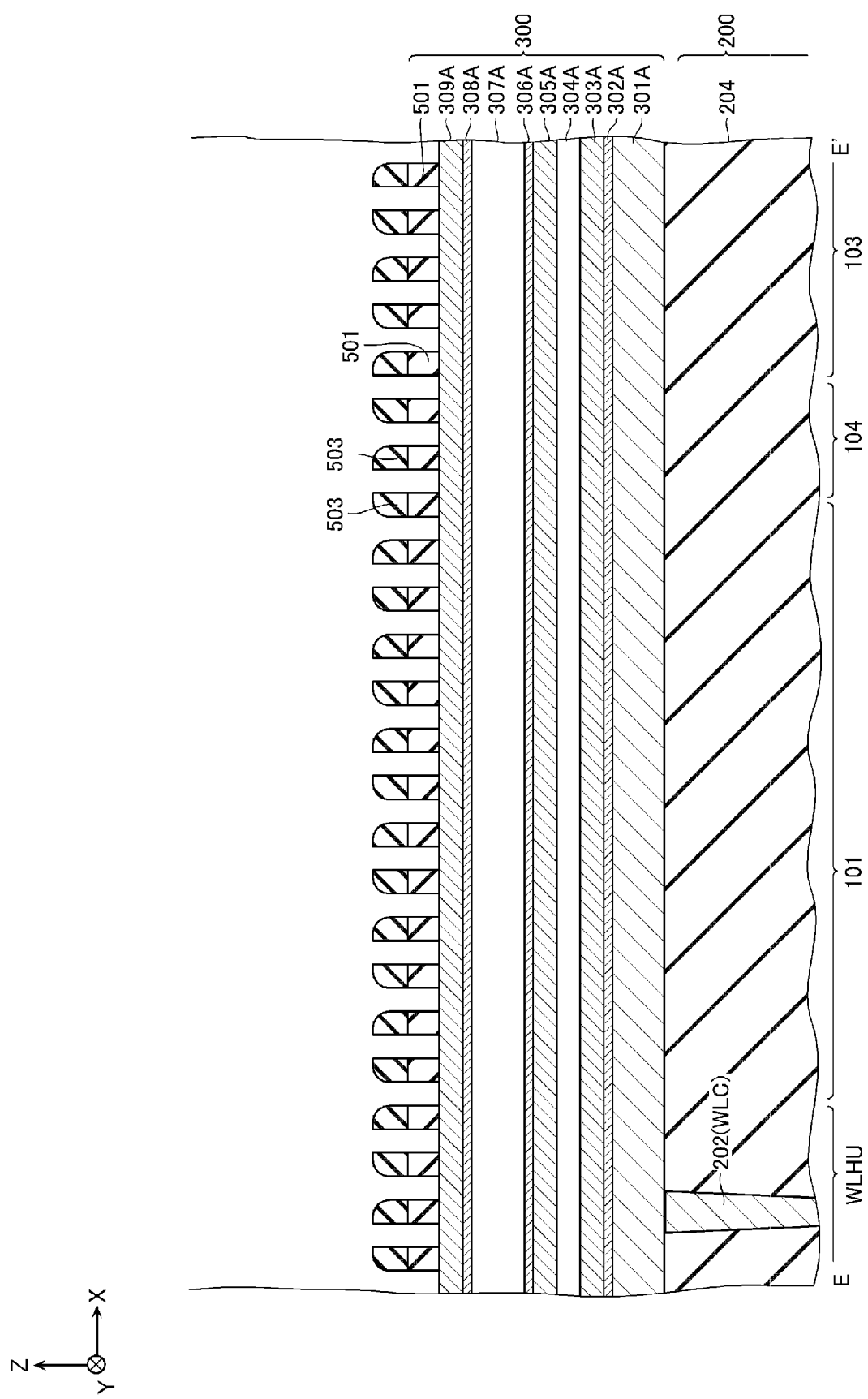
FIG. 12 is a schematic cross-sectional view illustrating the same manufacturing method.

Next, for example, as illustrated in FIG. 12, a part of the hard mask layer 501 is removed. This process is performed by, for example, anisotropic etching such as reactive ion etching (RIE) using the hard mask layer 503 as a mask. By this process, the hard mask layer 501 is divided in the X direction.

Figure 13:
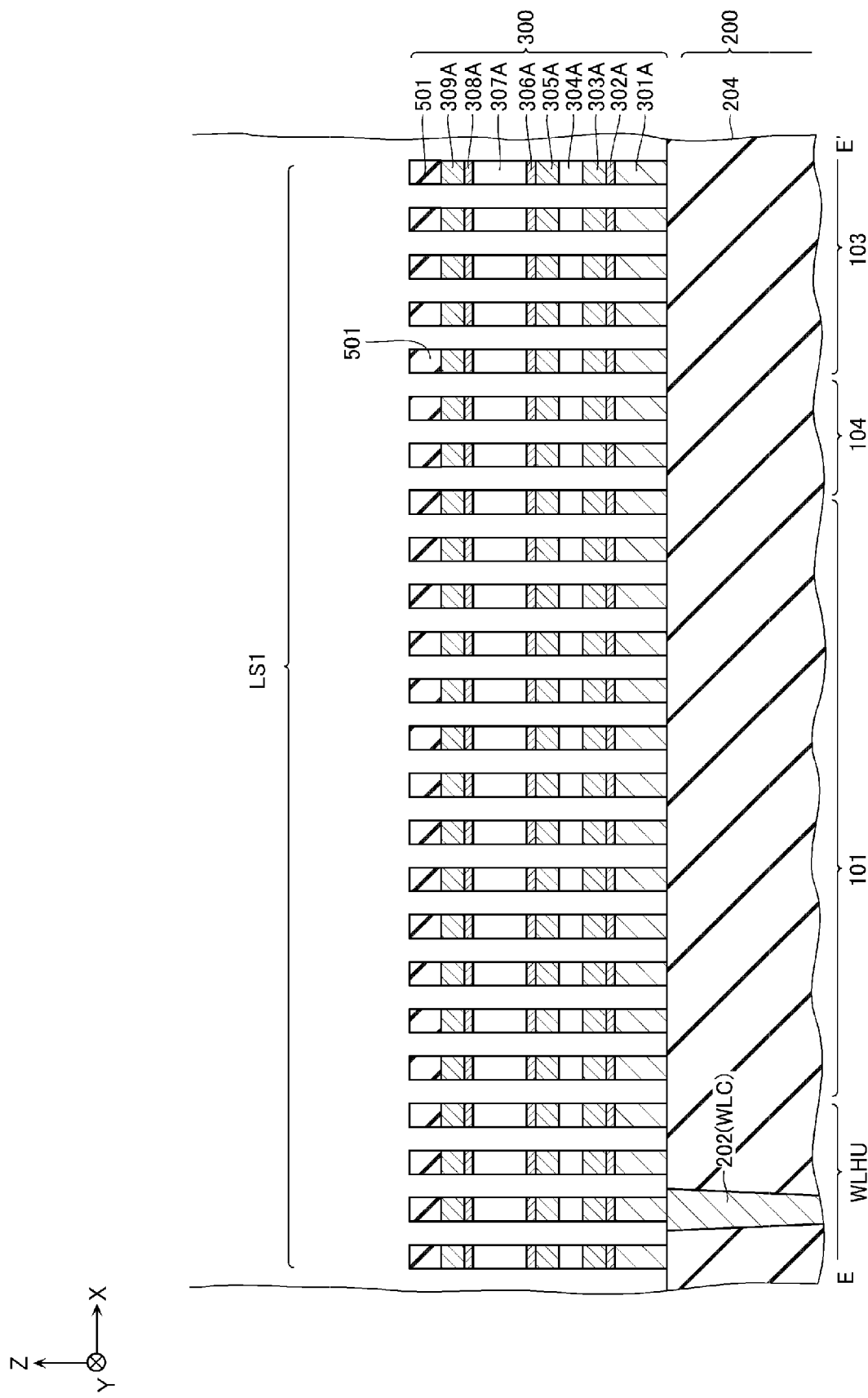
FIG. 13 is a schematic cross-sectional view illustrating the same manufacturing method.
Figure 14:
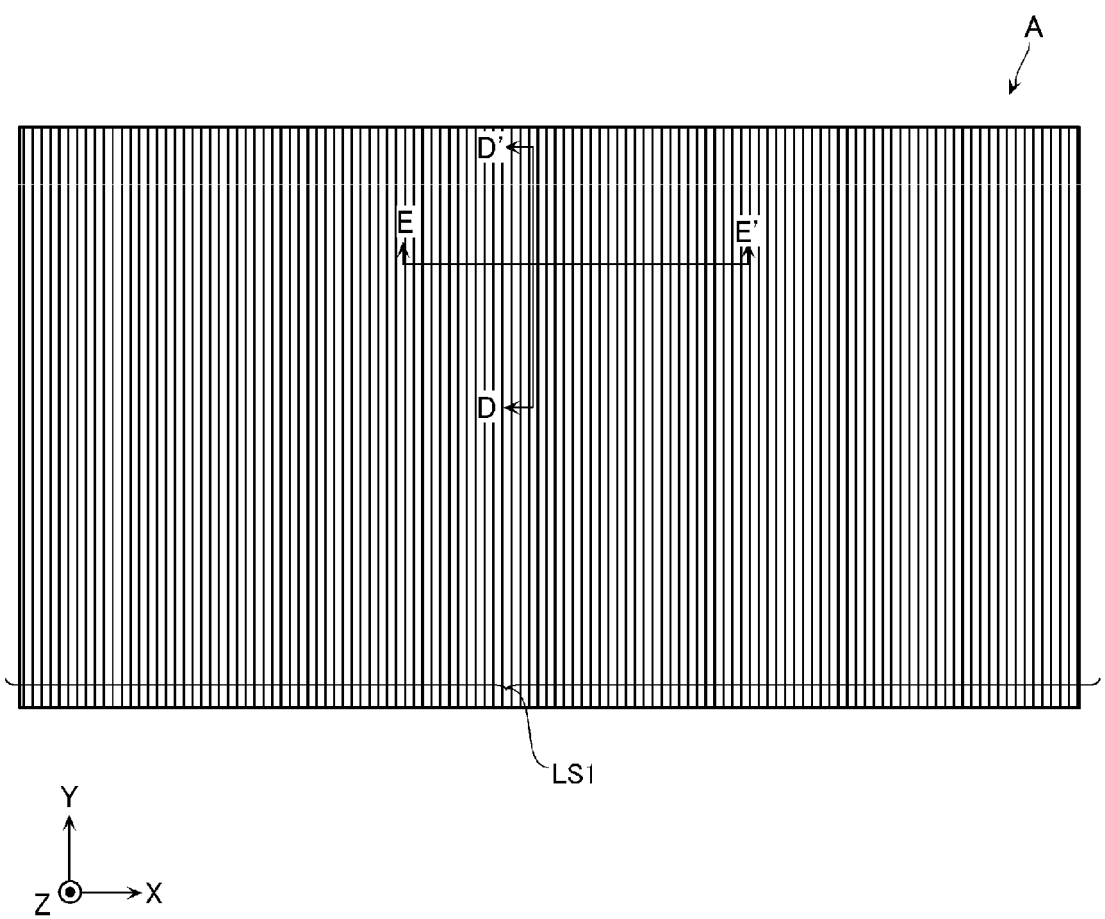
FIG. 14 is a schematic plan view illustrating the same manufacturing method.

Next, for example, as illustrated in FIGS. 13 and 14, a part of the conductive layer 301A, the barrier conductive layer 302A, the electrode layer 303A, the chalcogen layer 304A, the electrode layer 305A, the barrier conductive layer 306A, the chalcogen layer 307A, the barrier conductive layer 308A, and the electrode layer 309A is removed. This process is performed by, for example, anisotropic etching such as RIE using the hard mask layer 501 and the hard mask layer 503 as a mask. By this process, the above layers are divided in the X direction and a line-and-space pattern LS1 is formed along a pattern formed in the hard mask layer 501. Furthermore, by this process, the hard mask layer 503 is removed, and at least a part of the hard mask layer 501 remains. Further, the line-and-space pattern LS1 formed in this process is a uniform pattern at least inside a region surrounded by a dicing line.

Figure 15:
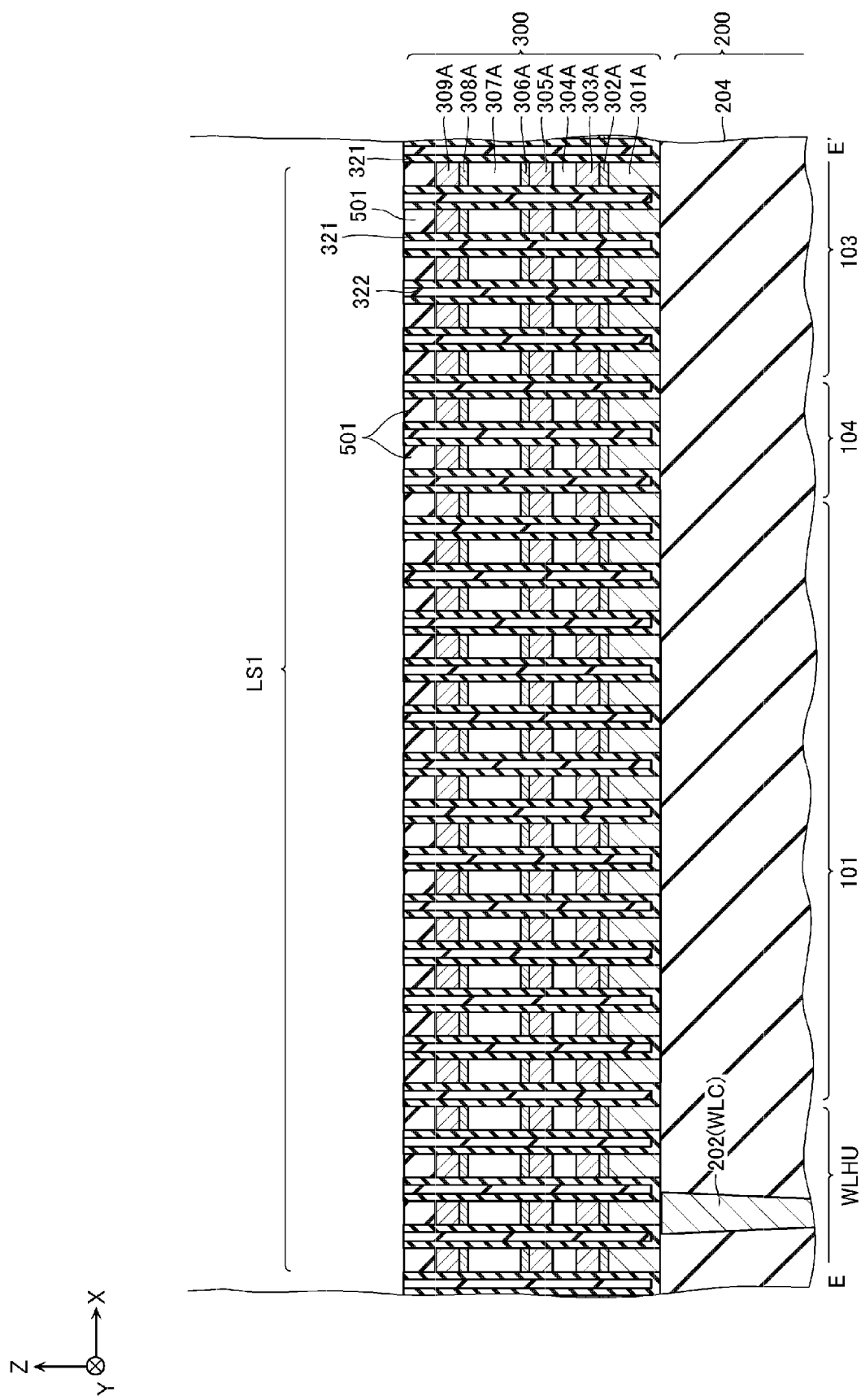
FIG. 15 is a schematic cross-sectional view illustrating the same manufacturing method.

Next, for example, as illustrated in FIG. 15, the barrier insulating layer 321 and the insulating layer 322 are formed on the upper surface of the insulating layer 204, on the upper surface of the hard mask layer 501, and on the side surfaces in the X direction of the conductive layer 301A, the barrier conductive layer 302A, the electrode layer 303A, the chalcogen layer 304A, the electrode layer 305A, the barrier conductive layer 306A, the chalcogen layer 307A, the barrier conductive layer 308A, and the electrode layer 309A. Next, the upper surface of the structure is subjected to planarization to expose the upper surface of the hard mask layer 501. The insulating layer 322 is formed, for example, by applying the material of the insulating layer 322 on the wafer by a method such as spin coating and performing a heat treatment. The planarization is performed by, for example, chemical mechanical polishing (CMP) using the hard mask layer 501 as a stopper.

Figure 16:
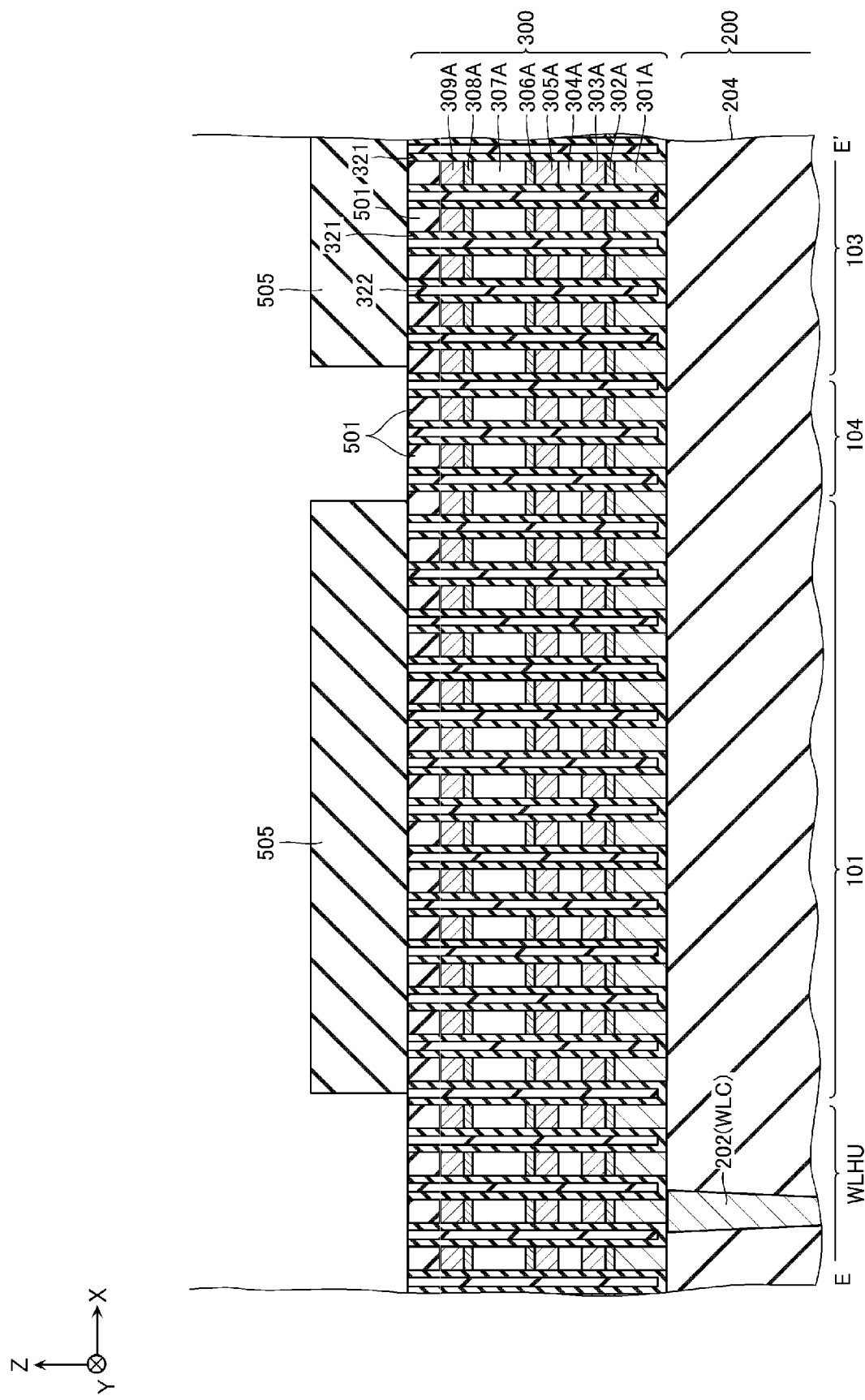
FIG. 16 is a schematic cross-sectional view illustrating the same manufacturing method.

Next, for example, as illustrated in FIG. 16, a mask material 505 is formed to cover at least the region 101 and the region 103.

Figure 17:
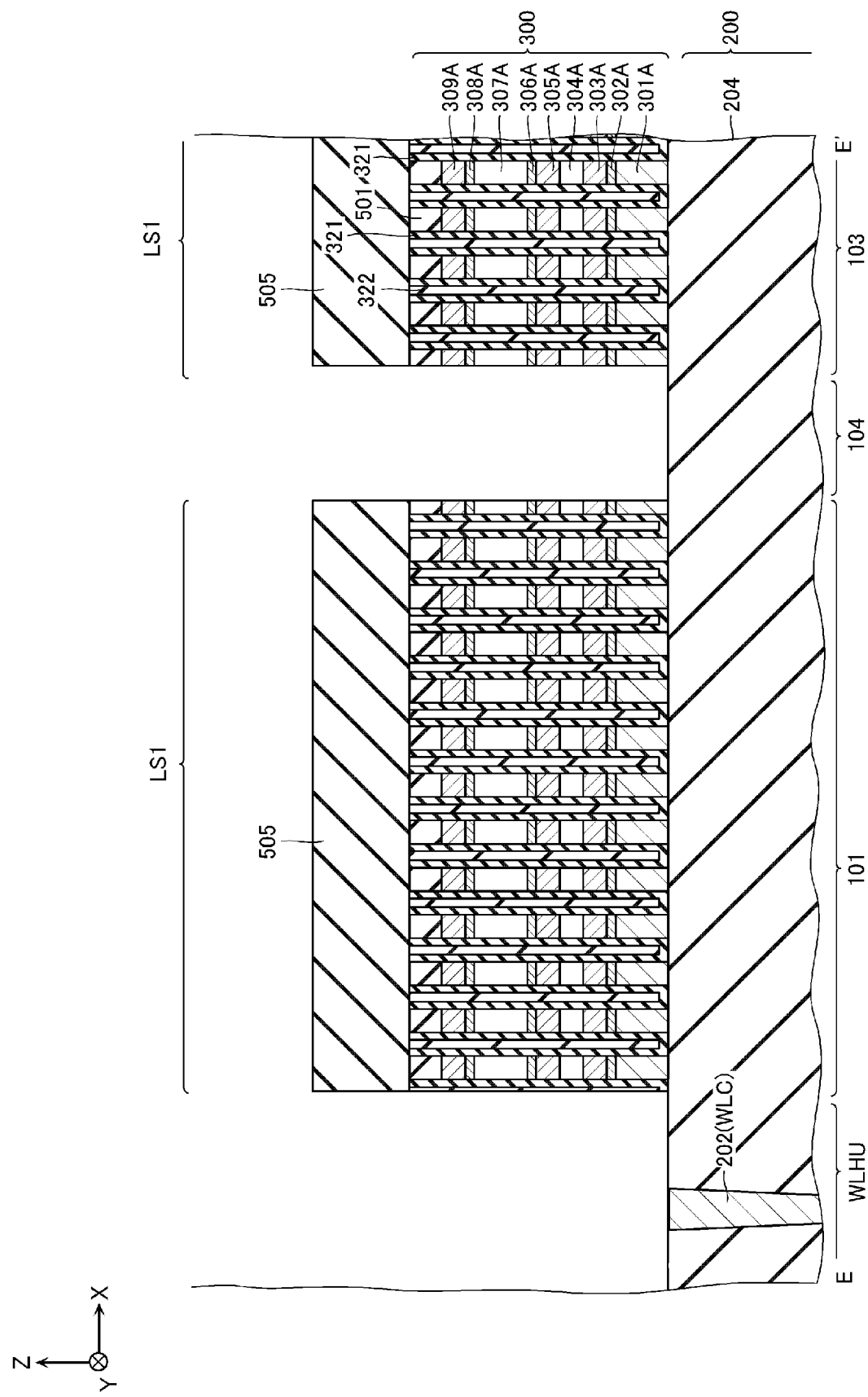
FIG. 17 is a schematic cross-sectional view illustrating the same manufacturing method.
Figure 18:
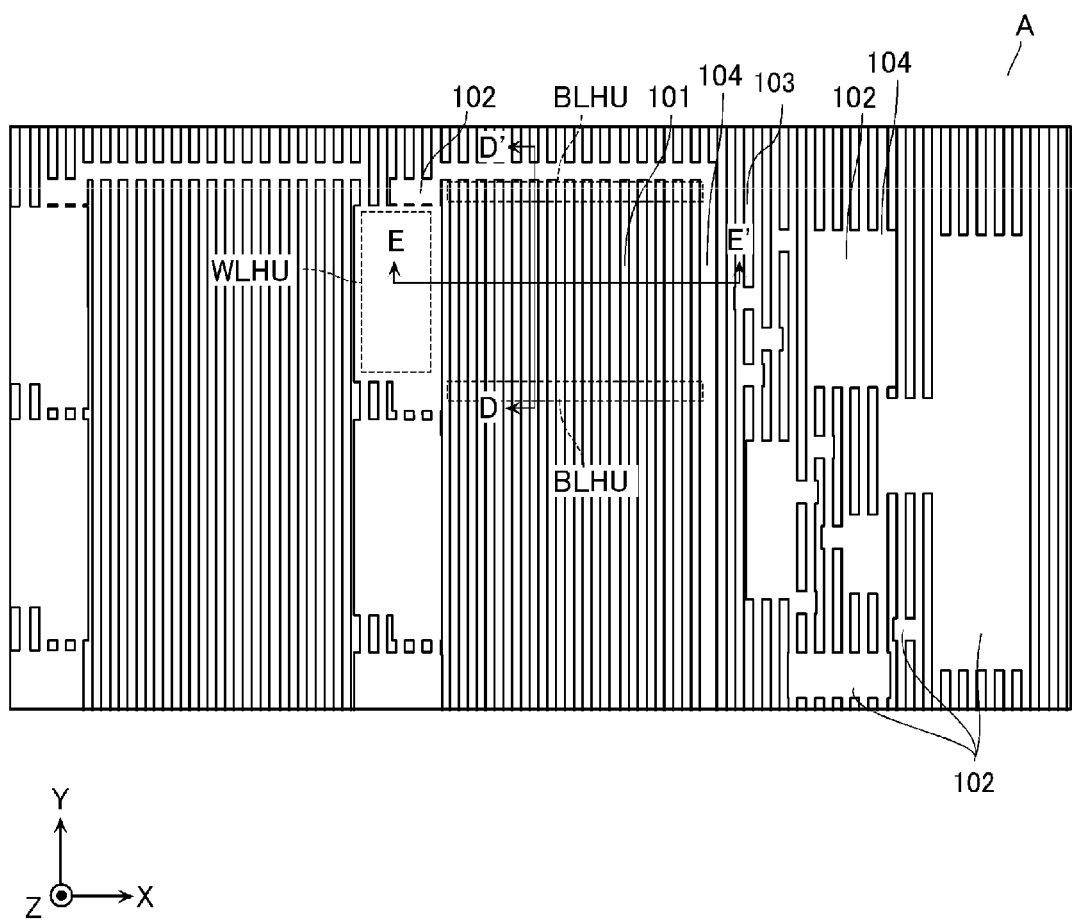
FIG. 18 is a schematic plan view illustrating the same manufacturing method.

Next, for example, as illustrated in FIGS. 17 and 18, a part of the structure formed on the insulating layer 204 in the region 102, the region 104, and the region WLHU is removed. This process is performed by, for example, anisotropic etching such as RIE using the mask material 505 as a mask.

Figure 19:
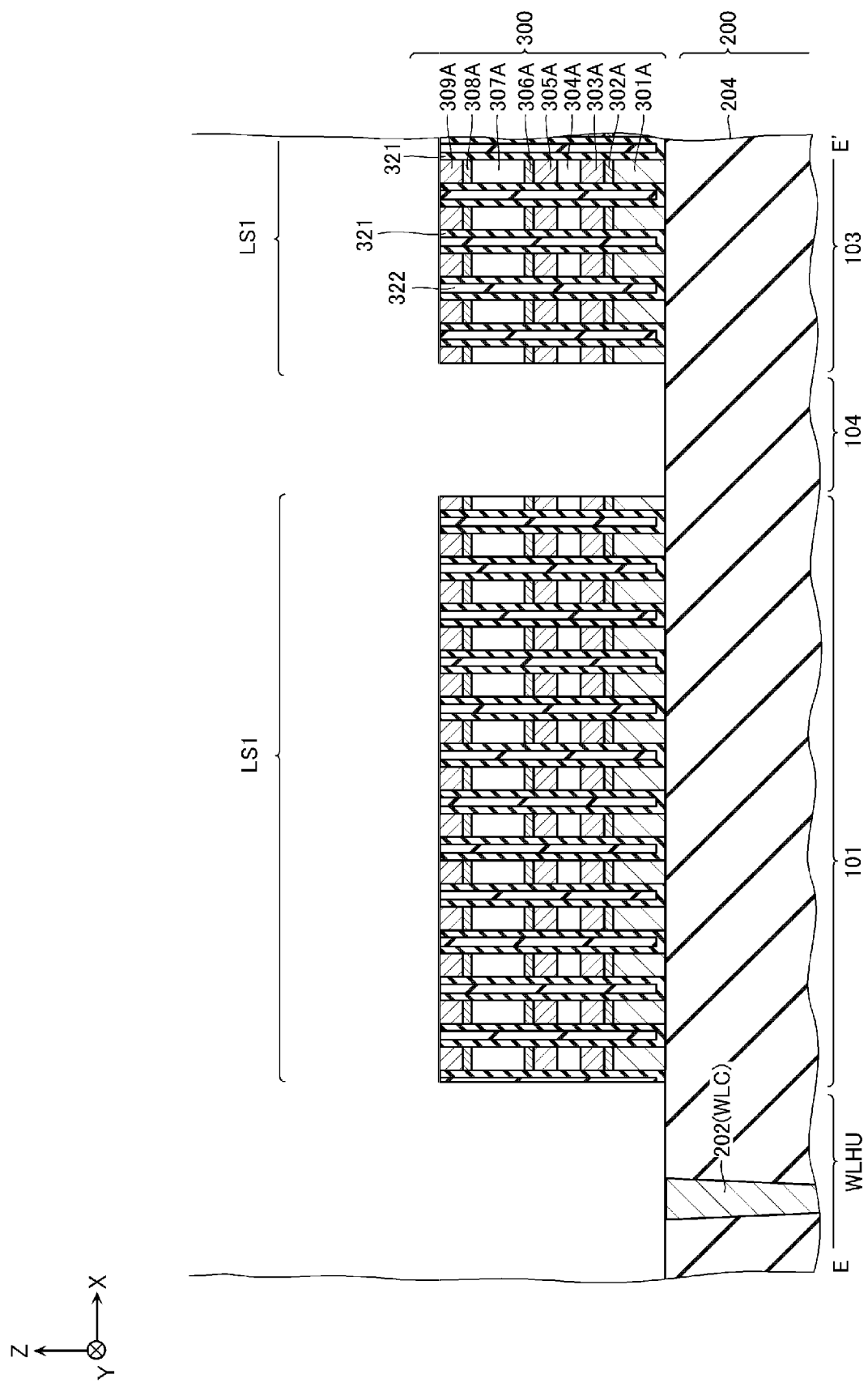
FIG. 19 is a schematic cross-sectional view illustrating the same manufacturing method.

Next, for example, as illustrated in FIG. 19, the mask material 505 is removed.

Figure 20:
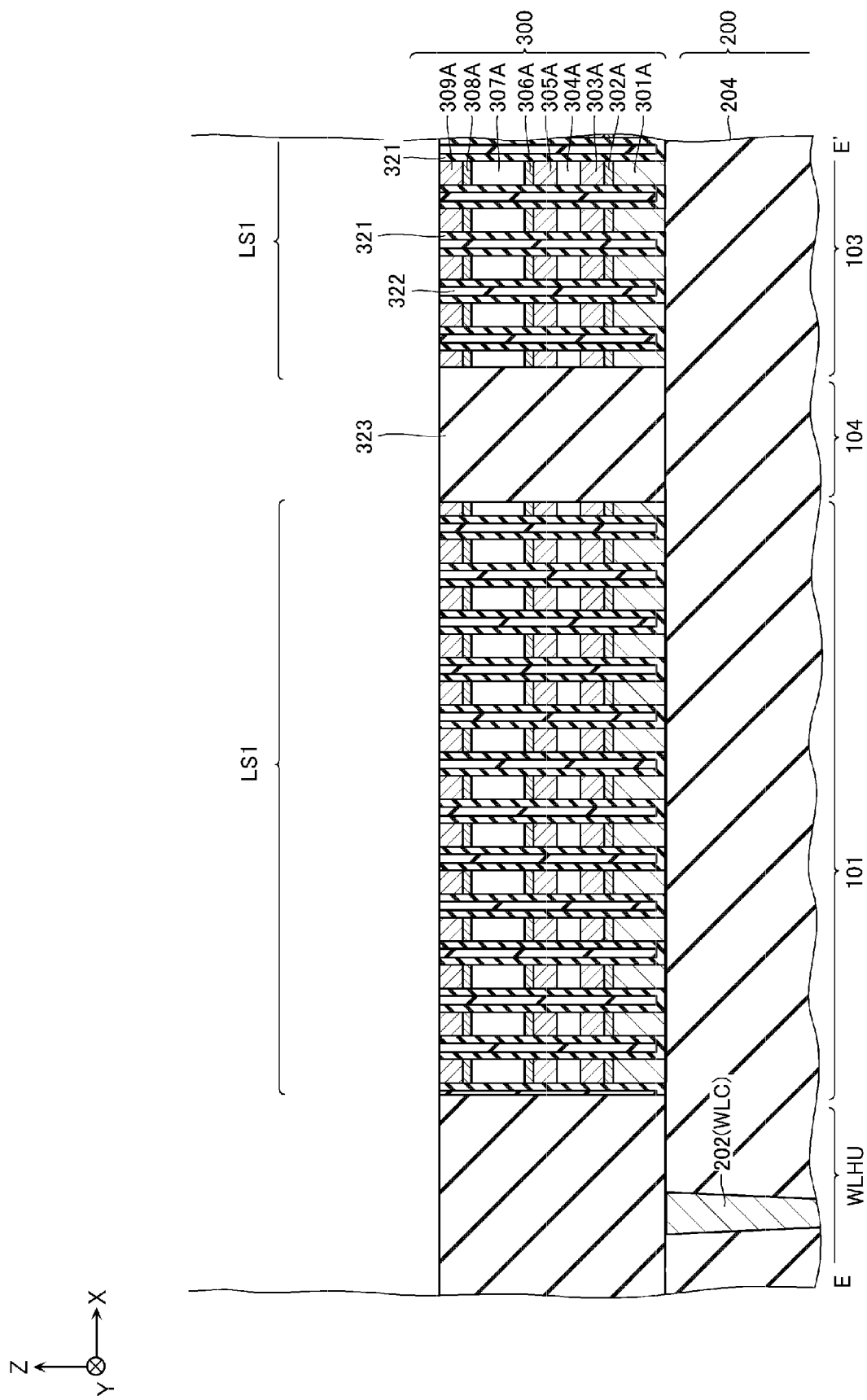
FIG. 20 is a schematic cross-sectional view illustrating the same manufacturing method.
Figure 21:
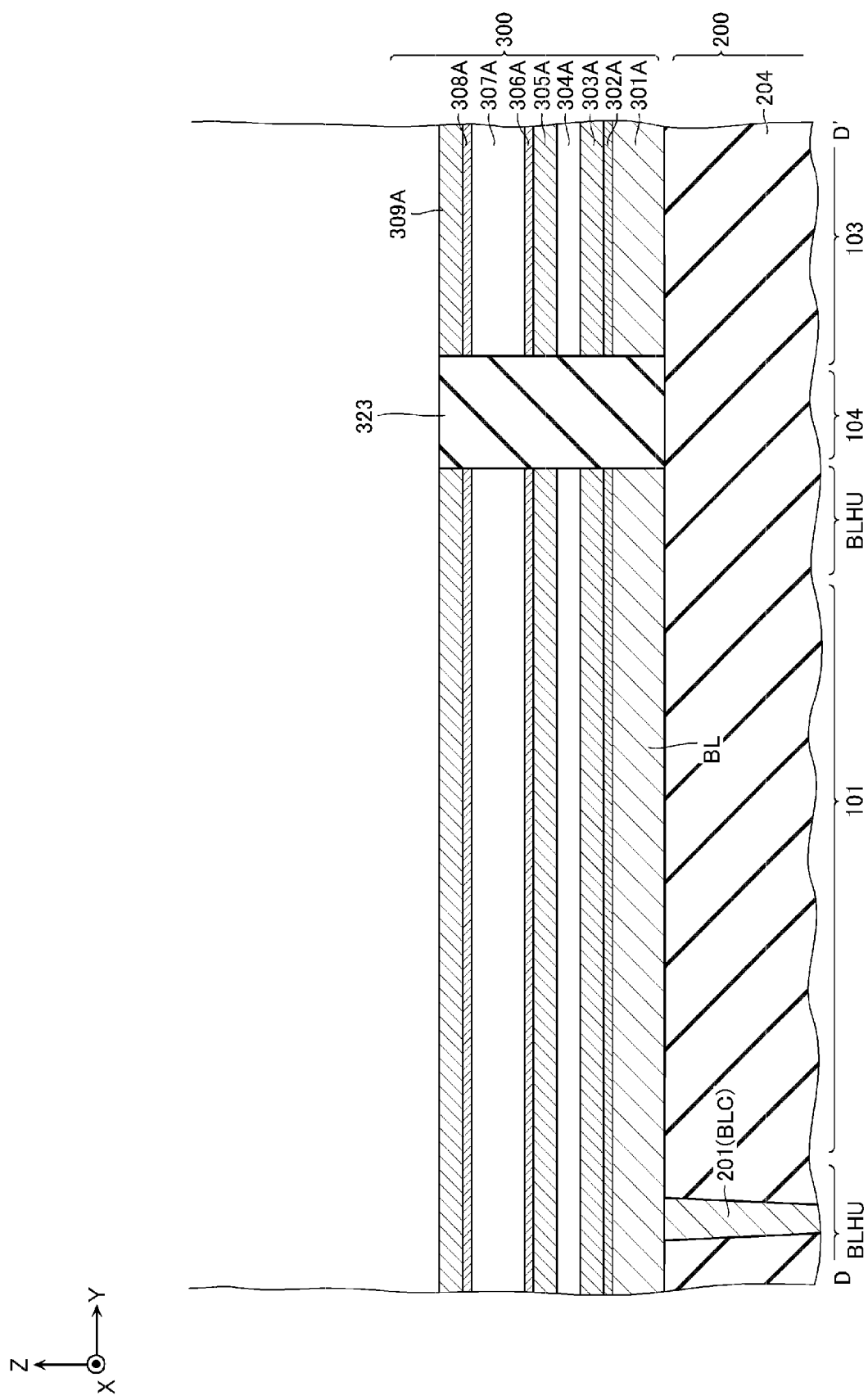
FIG. 21 is a schematic cross-sectional view illustrating the same manufacturing method.

Next, for example, as illustrated in FIGS. 20 and 21, the insulating layer 323 is formed, and apart of the insulating layer 323 and the hard mask layer 501 are removed from the upper surface of the structure to expose the upper surface of the electrode layer 309A. The process of forming the insulating layer 323 is performed by CVD using a gas such as TEOS. The process of exposing the upper surface of the electrode layer 309A is performed by CMP or wet etching. After this process, for example, the contact wiring 312 (FIG. 5) may be formed.

Figure 22:
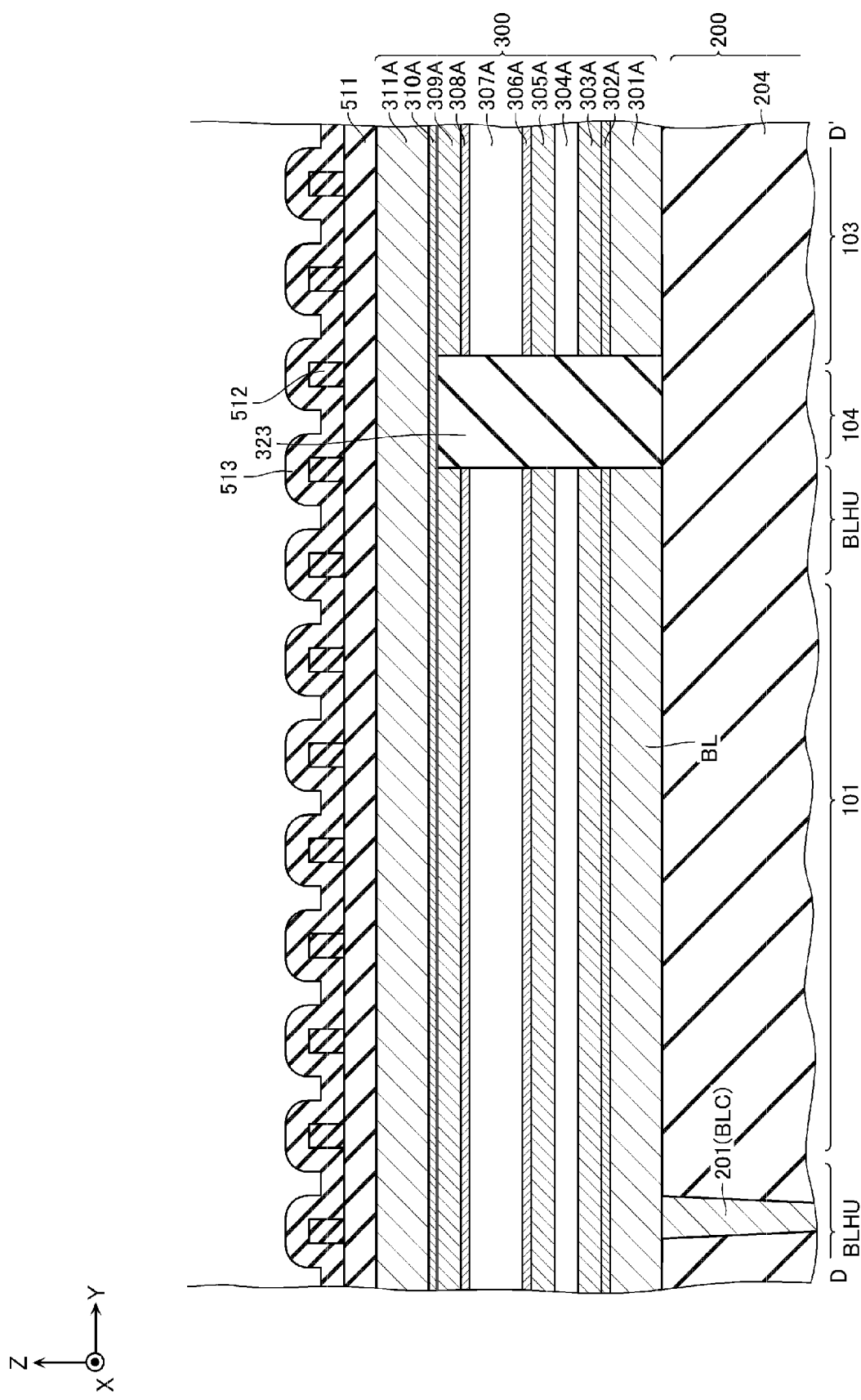
FIG. 22 is a schematic cross-sectional view illustrating the same manufacturing method.

Next, for example, as illustrated in FIG. 22, a stacked body including a barrier conductive layer 310A forming the barrier conductive layer 310, a conductive layer 311A forming the conductive layer 311, and a hard mask layer 511 such as silicon nitride (SiN) is formed on the upper surfaces of the electrode layer 309A and the insulating layer 323. This process is performed by, for example, PVD such as sputtering.

Next, for example, as illustrated in FIG. 22, a core material 512 such as carbon (C) is formed on the upper surface of the hard mask layer 511. The core material 512 is provided in all the regions including, for example, at least the region 101, the region 102, the region 103, and the region 104, and extends in the X direction and is formed side by side in the Y direction.

Next, for example, as illustrated in FIG. 22, a hard mask layer 513 such as silicon oxide ($SiO_2$) is formed on the upper surface of the hard mask layer 511 and on the side surface and the upper surface of the core material 512. This process is performed by, for example, CVD using a gas such as TEOS.

Figure 23:
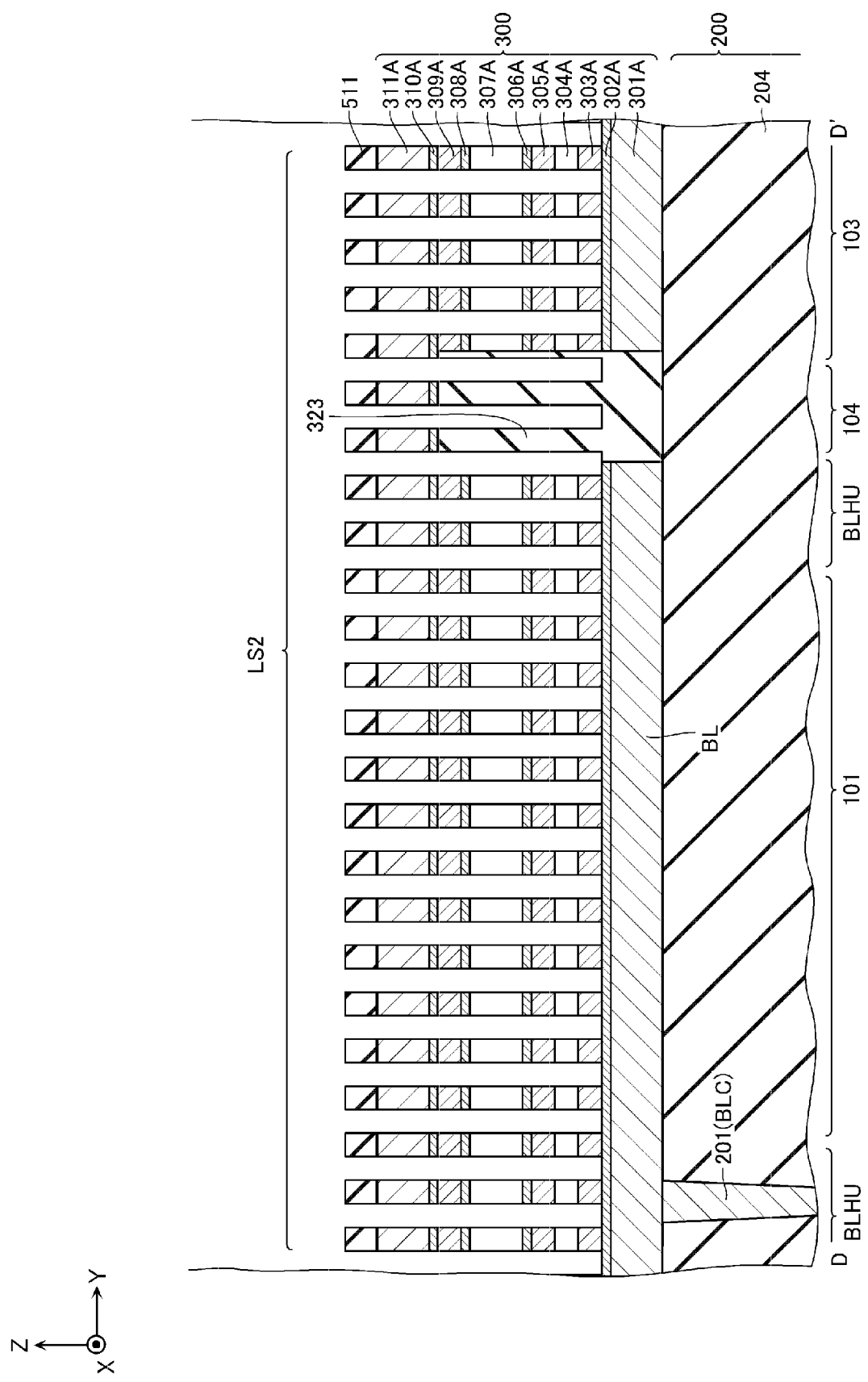
FIG. 23 is a schematic cross-sectional view illustrating the same manufacturing method.
Figure 24:
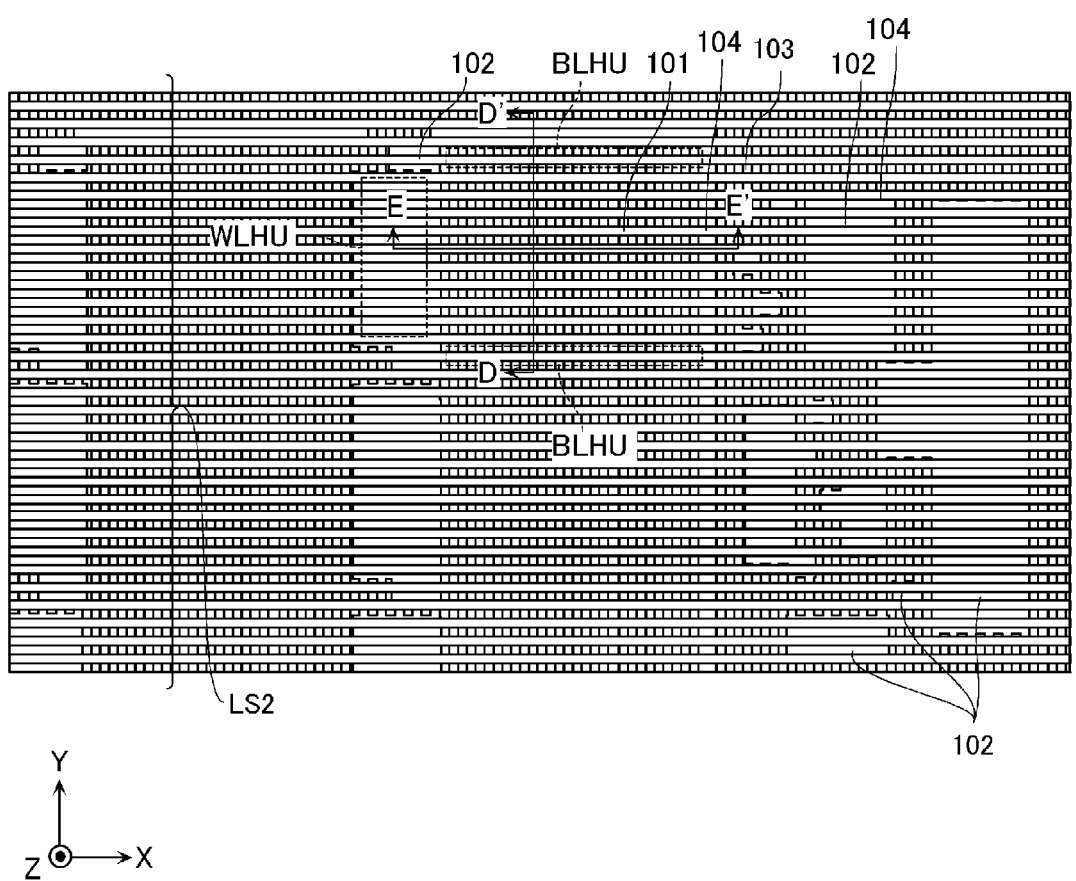
FIG. 24 is a schematic plan view illustrating the same manufacturing method.

Next, for example, as illustrated in FIGS. 23 and 24, the same processes as those described with reference to FIGS. 9 to 13 are performed. By these processes, the hard mask layer 511 is divided in the Y direction in all the regions including, for example, at least the region 101, the region 102, the region 103, and the region 104.

Further, by these processes, the electrode layer 303A, the chalcogen layer 304A, the electrode layer 305A, the barrier conductive layer 306A, the chalcogen layer 307A, the barrier conductive layer 308A, the electrode layer 309A, the barrier conductive layer 310A, and the conductive layer 311A are divided in the Y direction and a line-and-space pattern LS2 is formed along a pattern formed in the hard mask layer 511. Furthermore, by these processes, the core material 512 and the hard mask layer 513 are removed, and at least a part of the hard mask layer 511 remains. Further, the line-and-space pattern LS2 formed in these processes is a uniform pattern at least inside the region surrounded by the dicing line.

Figure 25:
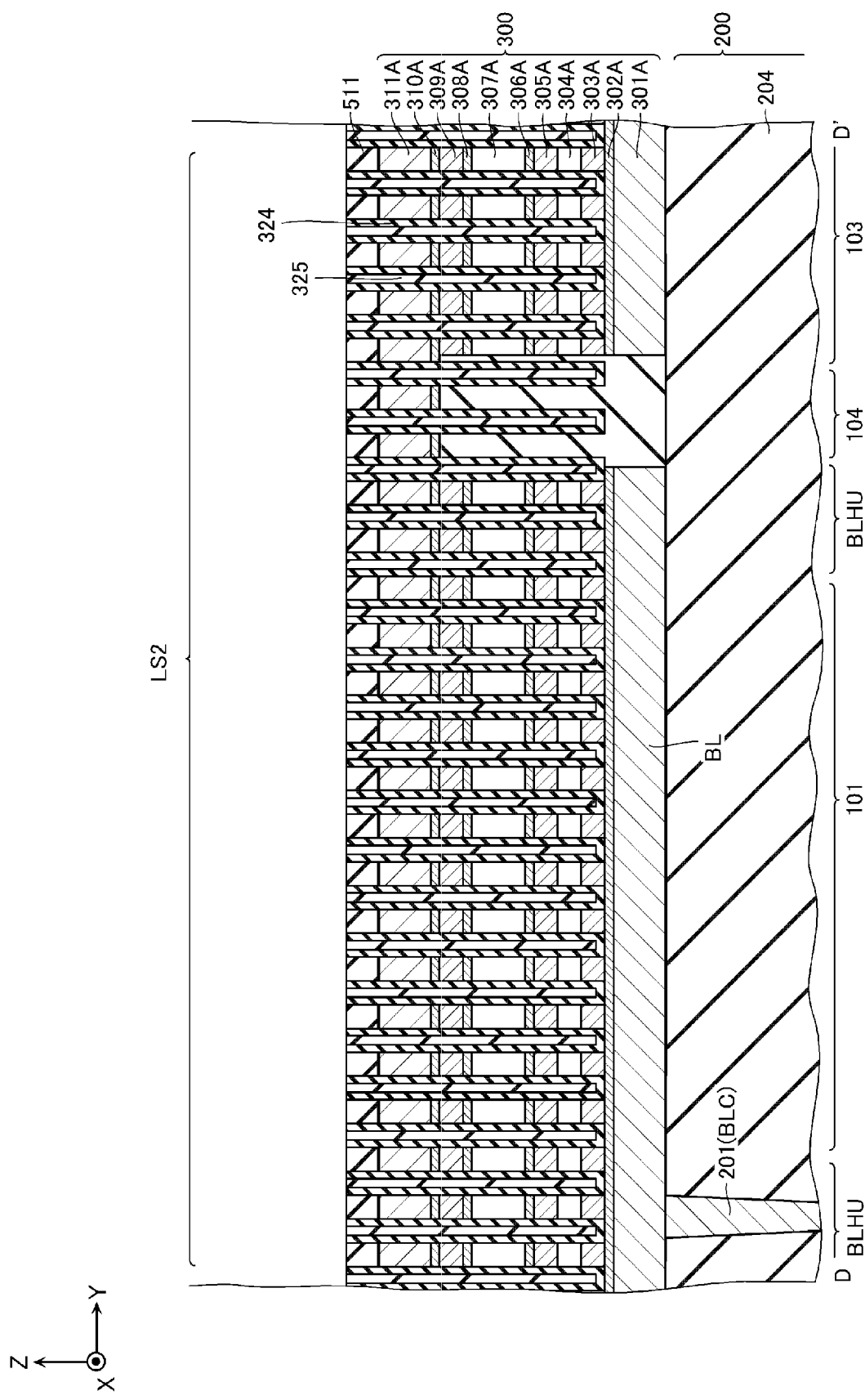
FIG. 25 is a schematic cross-sectional view illustrating the same manufacturing method.

Next, for example, as illustrated in FIG. 25, the barrier insulating layer 324 and the insulating layer 325 are formed on the upper surfaces of the barrier conductive layer 302A and the insulating layer 323, on the upper surface of the hard mask layer 511, and on the side surfaces in the Y direction of the electrode layer 303A, the chalcogen layer 304A, the electrode layer 305A, the barrier conductive layer 306A, the chalcogen layer 307A, the barrier conductive layer 308A, the electrode layer 309A, the barrier conductive layer 310A, the conductive layer 311A, and the hard mask layer 511. Next, the upper surface of the structure is subjected to planarization to expose the upper surface of the hard mask layer 511. The insulating layer 325 is formed, for example, by applying the material of the insulating layer 322 on the wafer by a method such as spin coating and performing a heat treatment. The planarization is performed by, for example, chemical mechanical polishing (CMP) using the hard mask layer 511 as a stopper.

Figure 26:
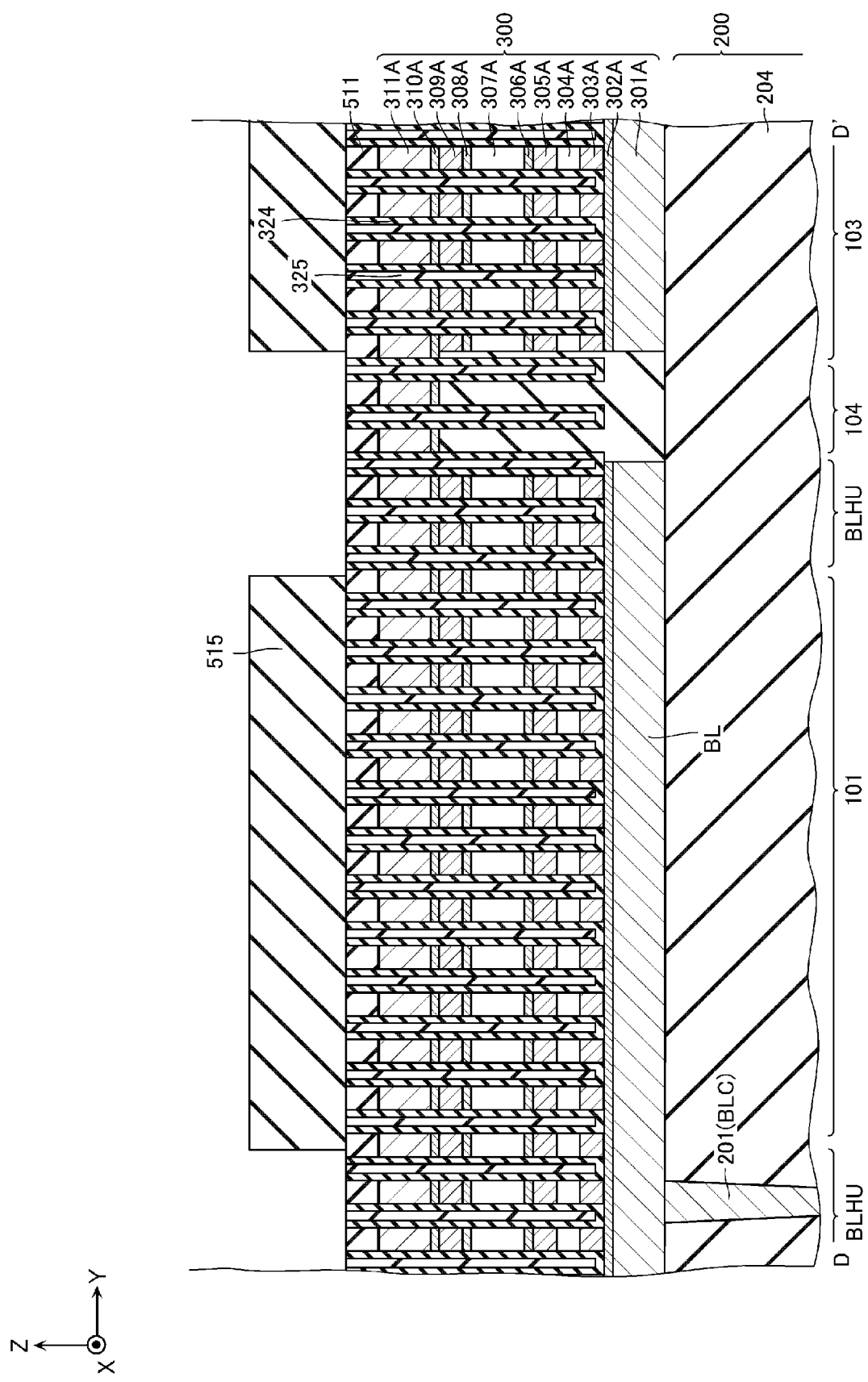
FIG. 26 is a schematic cross-sectional view illustrating the same manufacturing method.

Next, for example, as illustrated in FIG. 26, a mask material 515 is formed to cover the region 101 and the region 103.

Figure 27:
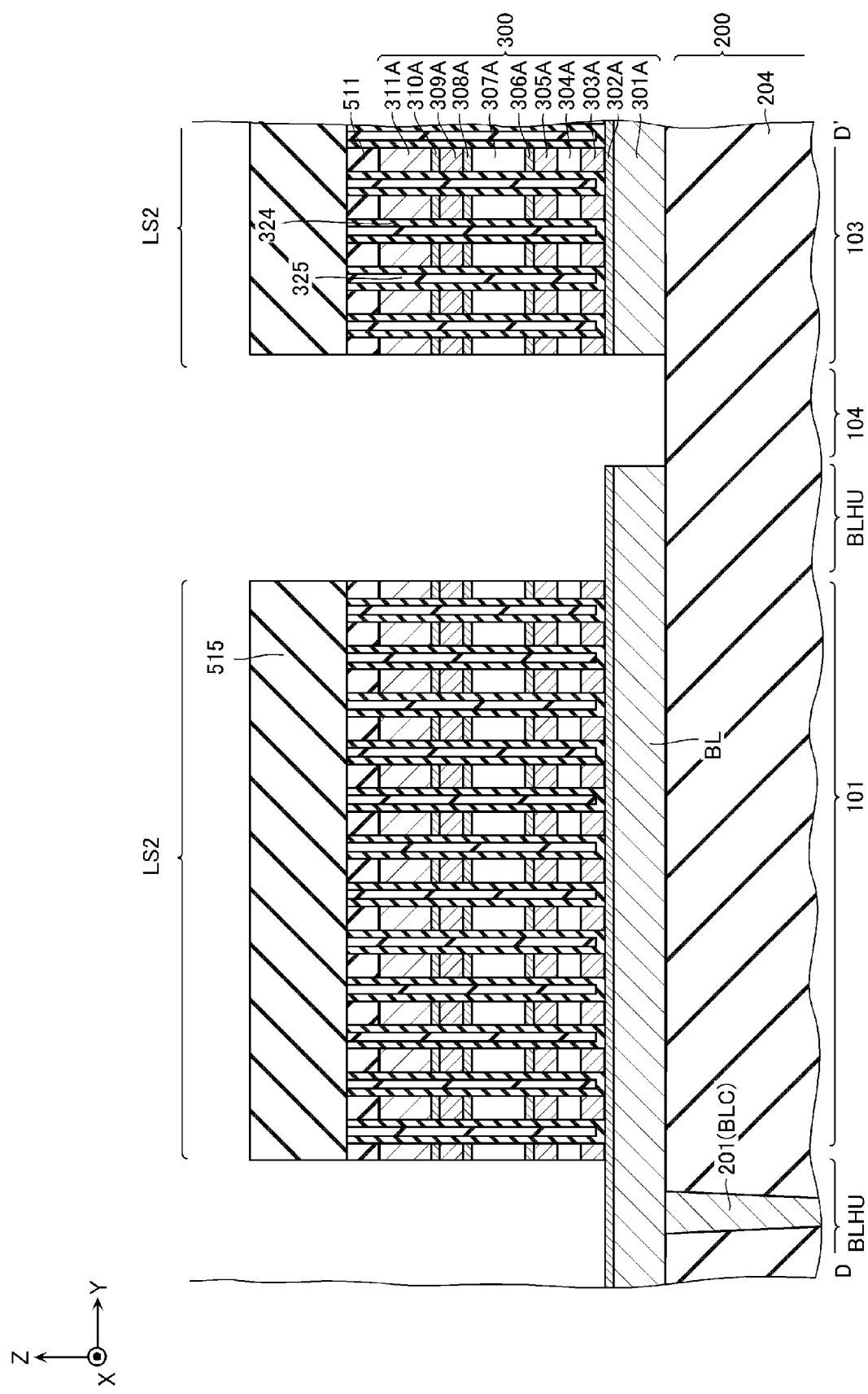
FIG. 27 is a schematic cross-sectional view illustrating the same manufacturing method.
Figure 28:
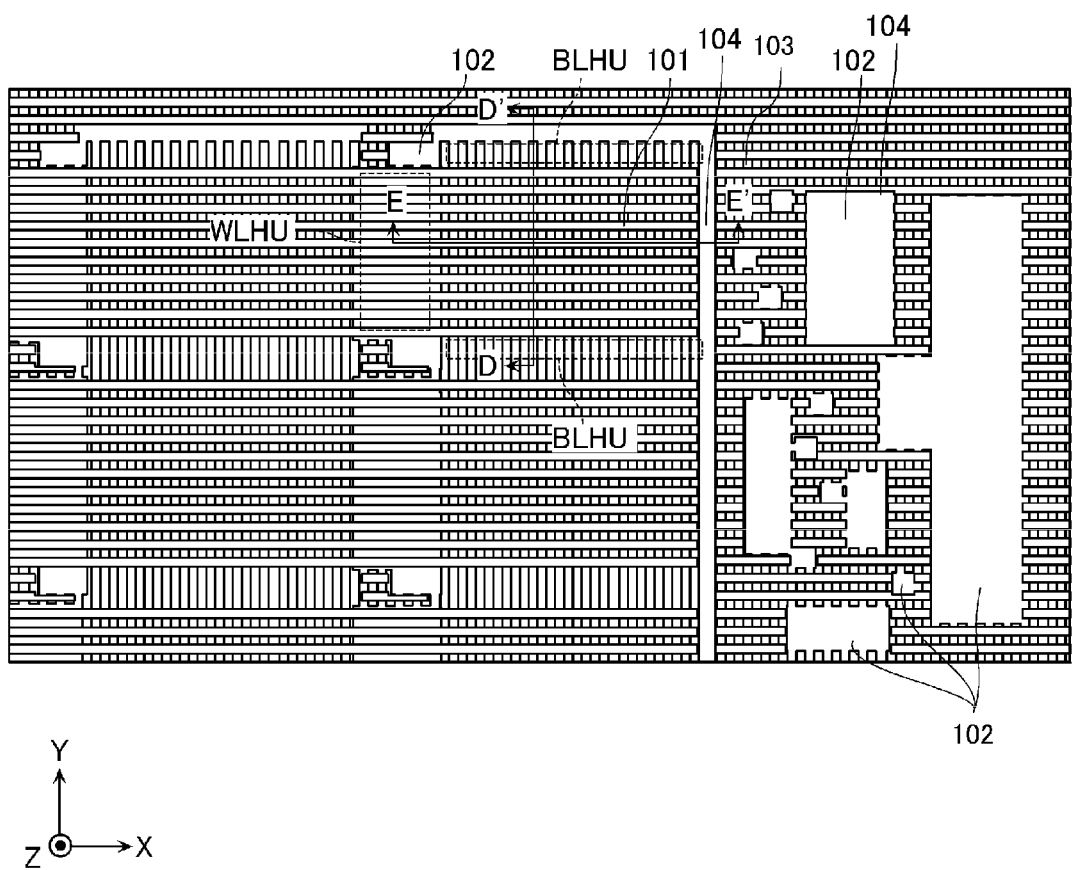
FIG. 28 is a schematic plan view illustrating the same manufacturing method.

Next, for example, as illustrated in FIGS. 27 and 28, at least the structure formed on the insulating layer 204 of the region 102 and the region 104 and the structure formed on the barrier conductive layer 302A of the region BLHU are removed. This process is performed by, for example, anisotropic etching such as RIE using the mask material 515 as a mask.

Figure 29:
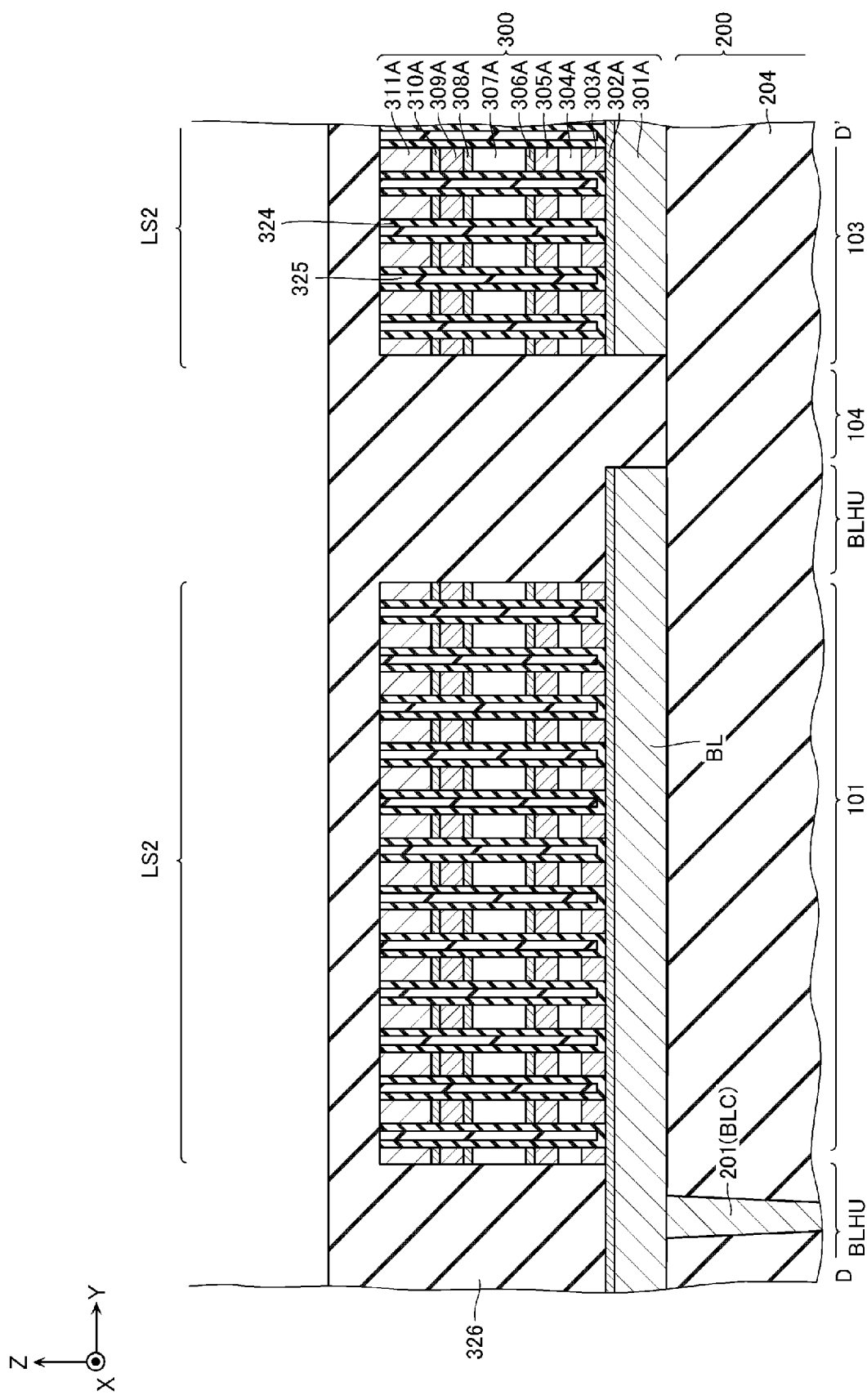
FIG. 29 is a schematic cross-sectional view illustrating the same manufacturing method.

Next, for example, as illustrated in FIG. 29, the mask material 515 is removed, and the insulating layer 326 is formed. This process is performed by, for example, CVD using a gas such as TEOS.

Figure 30:
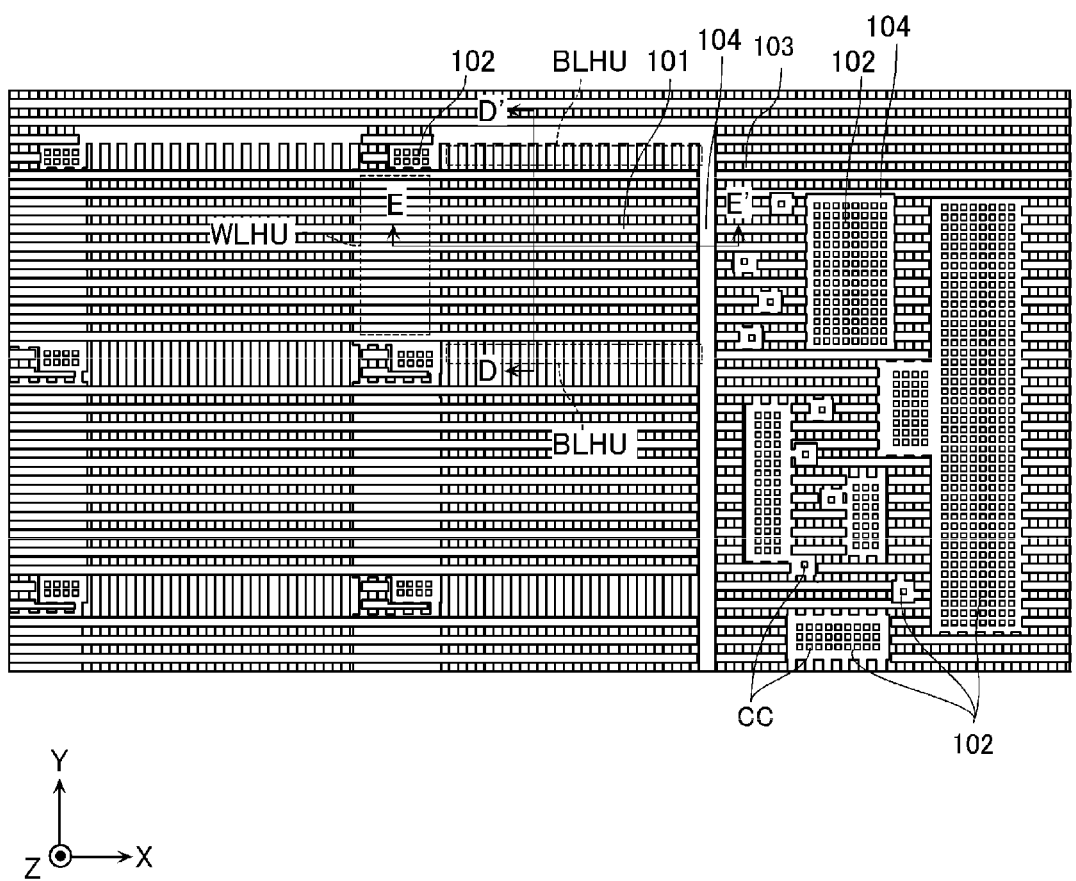
FIG. 30 is a schematic plan view illustrating the same manufacturing method.

Next, for example, as illustrated in FIG. 30, the plurality of contacts CC are formed in the region 102. This process is performed by, for example, CVD. Thus, the configuration described with reference to FIGS. 3, 7 and 8 is formed.

[Effects]

Figure 31:
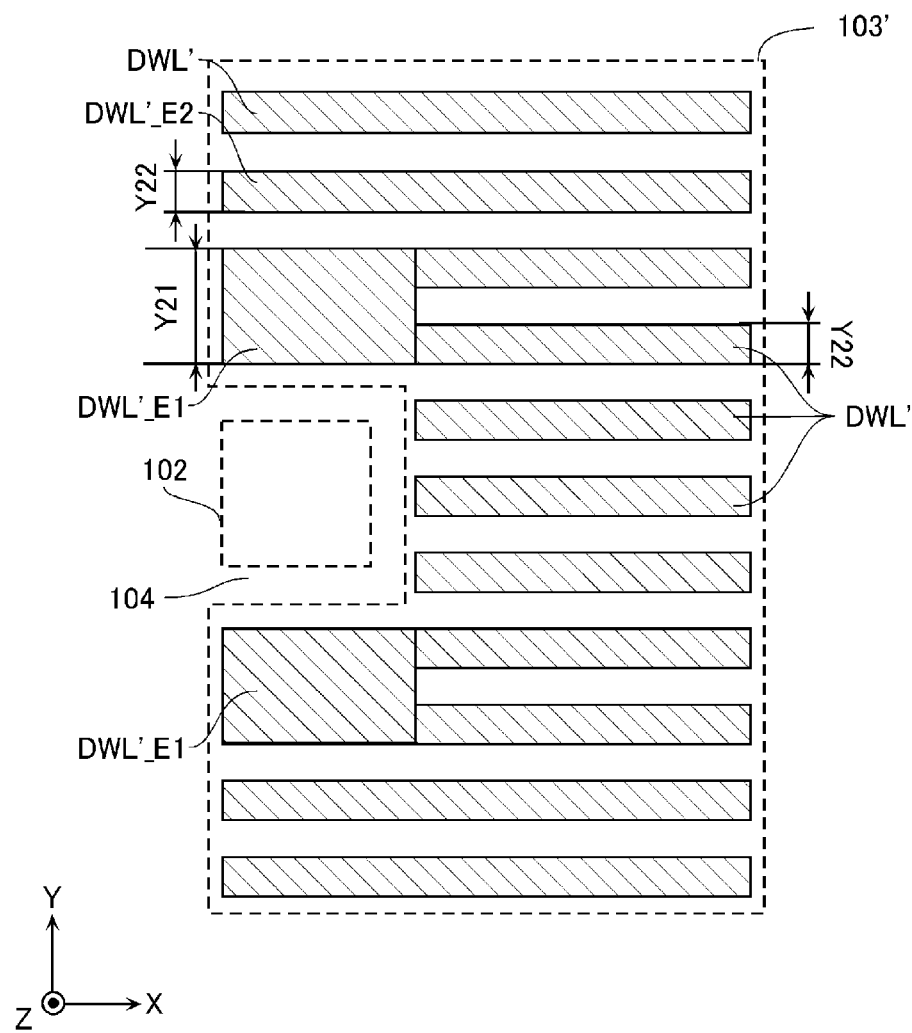
FIG. 31 is a schematic plan view illustrating a configuration of a part of a semiconductor storage device according to a first comparative example.

A configuration of a part of a semiconductor storage device according to a first comparative example is illustrated in FIG. 31. The semiconductor storage device according to the first comparative example includes a region 103' instead of the region 103.

As illustrated in FIG. 31, the region 103' includes a plurality of dummy word lines DWL' instead of the plurality of dummy word lines DWL. Although the region 103' includes the plurality of dummy bit lines DBL' instead of the plurality of dummy bit lines DBL, for convenience of explanation, illustration of the dummy bit lines DBL' is omitted.

Here, as illustrated in FIG. 31, a part of the plurality of dummy word lines DWL' has the side surface in the Y direction facing an opening of a dummy pattern corresponding to the region 102. Hereinafter, such a dummy word line DWL' is referred to as a dummy word line DWL'_E1. Here, the width Y21 in the Y direction of a portion of the dummy word line DWL'_E1 facing the opening is larger than the width Y22 in the Y direction of the other dummy word line DWL'.

In the manufacturing processes of the semiconductor storage device according to the first embodiment, as described with reference to FIG. 14, the line-and-space pattern is uniformly formed inside the region surrounded by the dicing line. Meanwhile, in the manufacturing processes of the first comparative example, the line-and-space pattern is separately formed in each region corresponding to the region 101 or the region 103'. Accordingly, the line-and-space pattern is not uniform inside the region surrounded by the dicing line.

Here, in the manufacturing processes of the first comparative example, the width Y21 in the Y direction of a portion of the line-and-space pattern corresponding to the portion of the dummy word line DWL'_E1 facing the opening (FIG. 31) is larger than the width Y22 in the Y direction of a portion of the line-and-space pattern corresponding to the other dummy word line DWL'. This is because the width Y21 of the portion of the dummy word line DWL'_E1 becomes thick during the photolithography and RIE processing due to the influence of the adjacent opening. Further, due to a complicated layout considering the influence of pattern thickening as described above, when a pattern having a plurality of wiring widths is patterned, this may significantly deteriorate the accuracy of patterning in photolithography.

Figure 32:
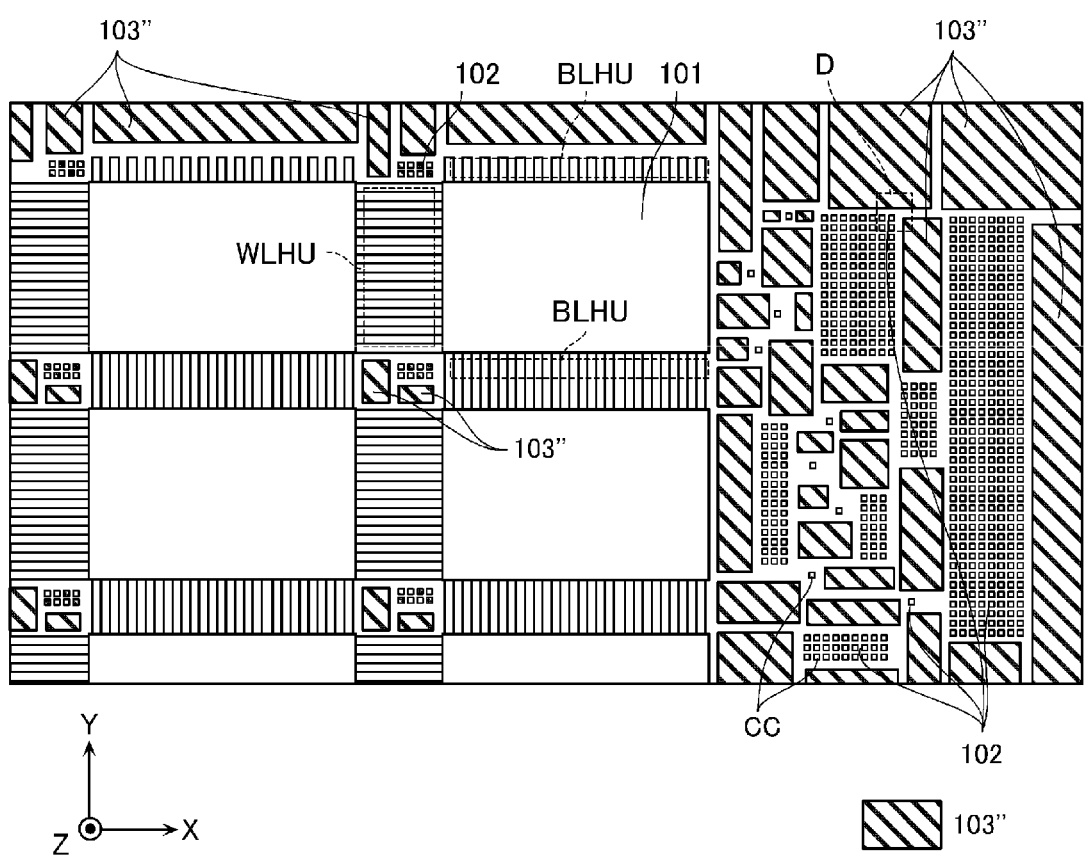
FIG. 32 is a schematic plan view illustrating a configuration of a part of a semiconductor storage device according to a second comparative example.
Figure 33:
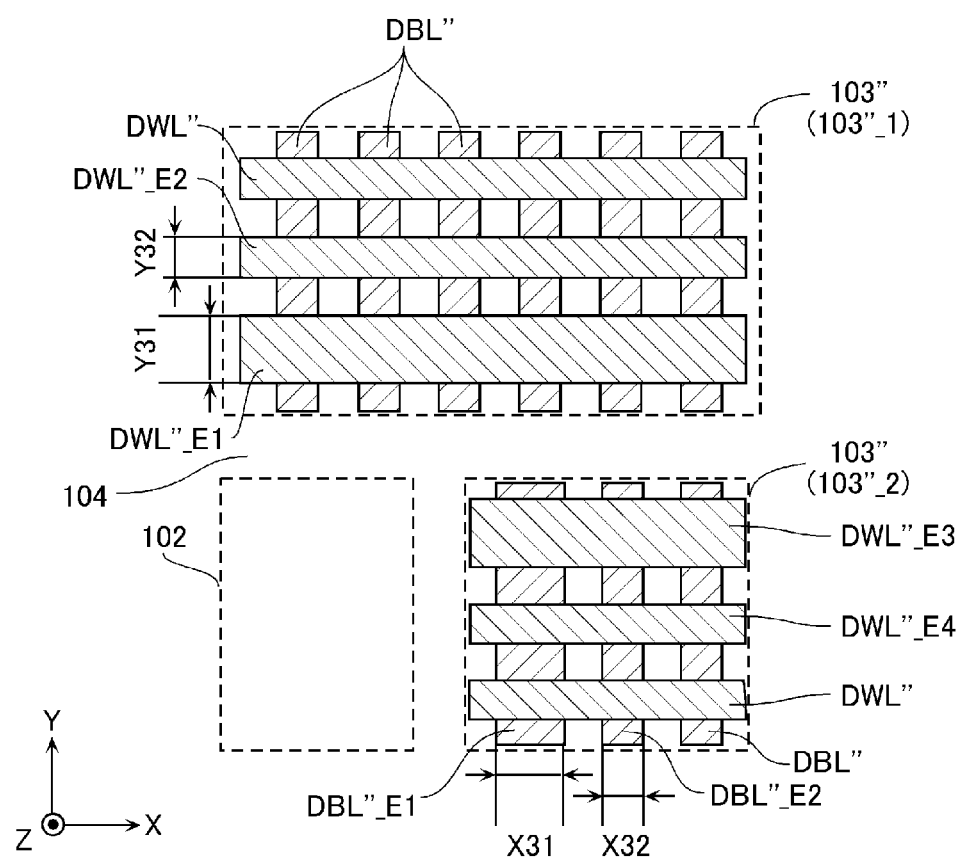
FIG. 33 is a schematic enlarged view of the portion indicated by D in FIG. 32.

A configuration of a part of a semiconductor storage device according to a second comparative example is illustrated in FIGS. 32 and 33. The semiconductor storage device according to the second comparative example includes a plurality of regions 103" instead of the region 103. Each of the plurality of regions 103" is formed in a rectangular shape.

FIG. 33 is a schematic enlarged view of the portion indicated by D in FIG. 32. As illustrated in FIG. 33, the plurality of regions 103" include, for example, a region 103"_1 and a region 103"_2. The region 103"_1 and the region 103"_2 include a plurality of dummy bit lines DBL"

instead of the plurality of dummy bit lines DBL, and include a plurality of dummy word lines DWL" instead of the plurality of dummy word lines DWL.

As illustrated in FIG. 33, in the region 103"_1, the plurality of dummy word lines DWL" include a dummy word line DWL"E1 closest to the region 102 in the Y direction and a dummy word line DWL"E2 second closest to the region 102. Here, in order to secure a margin in the photolithography process described above or because of pattern thickening during the RIE processing, the width Y31 in the Y direction of the dummy word line DWL"E1 is larger than the width Y32 in the Y direction of the dummy word line DWL"_E2.

As illustrated in FIG. 33, in the region 103"_2, the plurality of dummy word lines DWL" include a dummy word line DWL"_E3 closest to the region 103"_1 in the Y direction and a dummy word line DWL"_E4 second closest to the region 103"_1. The width in the Y direction of the dummy word line DWL"_E3 is larger than the width in the Y direction of the dummy word line DWL"_E2.

As illustrated in FIG. 33, in the region 103"2, the plurality of dummy bit lines DBL" include a dummy bit line DBL"_E1 closest to the region 102 in the X direction and a dummy bit line DBL"_E2 second closest to the region 102. The width X31 in the X direction of the dummy bit line DBL"_E1 is larger than the width X32 in the X direction of the dummy bit line DBL"_E2.

In the manufacturing processes of the semiconductor storage device according to the first comparative example, as described above, in the process corresponding to FIG. 14, the line-and-space pattern including the irregular pattern corresponding to the region 103' is formed. Meanwhile, in the manufacturing processes of the semiconductor storage device according to the second comparative example, a line-and-space pattern including a plurality of rectangular patterns corresponding to the region 103" is formed.

Here, when a dummy pattern is formed by combining the plurality of regions 103" formed in a rectangular shape as in the second comparative example, photolithography and a micro-processing do not need to be performed in a complicated layout as in the first comparative example. Accordingly, according to the second comparative example, the accuracy of patterning may be improved as compared with the first comparative example.

However, for example, as illustrated in FIG. 32, when the plurality of rectangular regions 103" are arranged in the peripheral region PA, a gap needs to be provided between the adjacent regions 103" in the X direction or in the Y direction to keep a certain distance or more between patterns. However, as illustrated in FIG. 32, when the regions 103" are not arranged in an orderly manner and a large number of gaps exist, the pattern density inside the peripheral region PA becomes uneven, and processing defects such as dishing are likely to occur in the CMP process. Besides, a design in which rectangular patterns of various sizes and shapes are combined may increase the load of a mask conversion processing.

Here, in the first embodiment, in the processes described with reference to FIGS. 13 and 14, the uniform line-and-space pattern LS1 is formed inside the region surrounded by the dicing line. Further, in the processes described with reference to FIGS. 17 and 18, the structure provided in the region 102 and the region 104 is removed. Further, in the processes described with reference to FIGS. 23 and 24, the uniform line-and-space pattern LS2 is formed inside the region surrounded by the dicing line. Further, in the processes described with reference to FIGS. 27 and 28, the structure provided in the region 102 and the region 104 is removed.

In such a manufacturing method, when forming the line-and-space patterns LS1 and LS2 and when dividing the structures along these patterns LS1 and LS2, the opening as described above does not exist inside the region surrounded by the dicing line. Accordingly, it is not necessary to make the wiring width of a part or the entirety of a certain wiring thick. Accordingly, with such a manufacturing method, it is possible to form the irregular region 103 without causing deterioration in the accuracy of patterning in photolithography as described above. Further, the irregular region 103 may cover the regions other than the region 101, the region 102, and the region 104 without gaps. Thus, it is possible to reduce a difference in the pattern density that occurs in a processing surface, thereby suppressing the occurrence of processing defects.

Furthermore, in the manufacturing processes illustrated in the first embodiment, after the insulating layer 322 (FIG. 15) and the insulating layer 325 (FIG. 25) are embedded between the structures divided along the pattern LS1 and the pattern LS2, an RIE processing is performed to remove unnecessary parts of the structures divided along the pattern LS1 and the pattern LS2. In this process, the wiring width at the end of the region 103, for example, the width Y11 in the Y direction of the dummy word line DWL_E1 may be smaller than the width Y12 in the Y direction of the dummy word line DWL_E2 second closest to the region 101 in the Y direction.

Other Embodiments

The first embodiment exemplifies the semiconductor storage device having a single memory layer 300 composed of the plurality of bit lines BL and word lines WL. However, the memory layer may be multiple layers. For example, a structure in which a memory layer having the same configuration as that of the memory layer 300 is stacked on the upper layer of the memory layer 300 may be adopted.

Further, in the first embodiment, the variable resistance element VR is provided above the non-linear element NO. However, for example, the variable resistance element VR may be provided below the non-linear element NO.

Further, in the first embodiment, the chalcogen layer 307 is adopted as the variable resistance element VR, and the chalcogen layer 304 is adopted as the nonlinear element NO. However, the materials of the variable resistance element VR and the nonlinear element NO may be adjusted as appropriate. For example, the variable resistance element VR may include a metal oxide such as hafnium oxide (HfO), may include a pair of magnetic layers and a tunnel insulating film provided therebetween, or may include any other configuration. Further, for example, the non-linear element NO may be a diode, an MIM junction, or an MIS junction, or may be any other non-linear element.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a first region;
a second region; and
a third region adjacent to at least one of the first region or the second region,
wherein the first region includes:
a plurality of first wirings extending in a first direction and arranged side by side in a second direction intersecting with the first direction;
a plurality of second wirings extending in the second direction and arranged side by side in the first direction to intersect with the plurality of first wirings, respectively; and
a plurality of first memory cells provided at intersections of the plurality of first wirings and the plurality of second wirings,
wherein the second region includes a first contact extending in a third direction intersecting with both the first direction and the second direction, the first contact electrically connected to the first wiring,
wherein the third region includes:
a plurality of first dummy wirings extending in the first direction and arranged side by side in the second direction; and
a plurality of second dummy wirings extending in the second direction and arranged side by side in the first direction to intersect with the plurality of first dummy wirings, respectively,
wherein a width in the first direction of a first one of the second dummy wirings, closest to the first region or the second region in the first direction, is equal to or less than a width in the first direction of a second one of the second dummy wirings next closest to the first region or the second region in the first direction, and
wherein a width in the second direction of a first one of the first wirings, closest to the third region in the second direction, is less than a width in the second direction of a second one of the first wiring next closest to the third region.

2. The semiconductor storage device according to claim 1, wherein the width in the first direction of the first one of the second dummy wiring is less than the width in the first direction of the second one of the second dummy wiring.

3. The semiconductor storage device according to claim 1, comprising a plurality of dummy memory cells provided at intersections of the plurality of first dummy wirings and the plurality of second dummy wirings.

4. The semiconductor storage device according to claim 3, comprising a control circuit configured to control the plurality of memory cells,
wherein the control circuit is electrically connected to the plurality of memory cells via the plurality of first wirings and the plurality of second wirings, and
wherein the control circuit is not electrically connected to the plurality of dummy memory cells.

5. The semiconductor storage device according to claim 3, wherein each of the memory cells and each of the dummy memory cells include an electrode layer that contains carbon.

6. The semiconductor storage device according to claim 1 wherein the plurality of first dummy wirings is not electrically connected to a control circuit.

7. The semiconductor storage device according to claim 1, further comprising:
a fourth region, wherein the fourth region include a plurality of third wirings extending in the second direction and arranged side by side in the first direction to intersect with the plurality of first wirings, respectively; and
a plurality of second memory cells provided at intersections of the plurality of first wirings and the plurality of third wirings.

8. The semiconductor storage device according to claim 7, further comprising:
a second contact extending in the third direction, the second contact electrically connected to the first wiring.

9. A semiconductor storage device comprising:
a first region including a memory cell;
a second region including a contact; and
a third region adjacent to at least one of the first region or the second region,
wherein the first region includes:
a first wiring extending in a first direction;
a second wiring extending in a second direction intersecting with the first direction to intersect with the first wiring; and
the memory cell provided at an intersection of the first wiring and the second wiring,
wherein the contact extends in a third direction intersecting with both the first direction and the second direction, and
wherein the third region includes:
a first dummy wiring arranged side by side with the first wiring or the contact in the first direction and extending in the first direction;
a second dummy wiring extending in the second direction and intersecting with the first dummy wiring;
a third dummy wiring extending in the first direction and intersecting with the second dummy wiring;
a fourth dummy wiring arranged side by side with the second wiring or the contact, extending in the second direction, and intersecting with the third dummy wiring; and
a fifth dummy wiring provided between the first dummy wiring and the third dummy wiring and extending in the first direction,
wherein the fifth dummy wiring has a first portion adjacent to the first region or the second region in the second direction and a second portion intersecting with the second dummy wiring, and
wherein a width in the second direction of the first portion is less than a width in the second direction of the second portion.

10. A method for making a semiconductor storage device comprising:
forming a plurality of memory cells in a first region of a substrate, wherein the plurality of memory cells are at intersections of a plurality of first wirings and a plurality of second wirings, the first wirings extending in a first direction and the second wirings extending in a second direction;
forming a contact in a second region of the substrate, wherein the contact extends in a third direction intersecting with both the first direction and the second direction; and
forming a plurality of first dummy wirings and a plurality of second dummy wirings in the second direction in a third region of the substrate, the first dummy wirings extending in the first direction and the second dummy wirings extending in the second direction;
wherein a width in the first direction of a first one of the second dummy wirings closest to the first region or the second region in the first direction is less than a width in the first direction of a second one of the second dummy wirings next closest to the first region or the second region in the first direction.

11. The method according to claim 10, further comprising:
forming a plurality of dummy memory cells at intersections of the plurality of first dummy wirings and the plurality of second dummy wirings.

12. The method according to claim 11, wherein each of the memory cells and each of the dummy memory cells include an electrode layer that contains carbon.

13. The method according to claim 11, wherein the plurality of memory cells are connected to a control circuit via the plurality of first wirings and the plurality of second wirings, and the plurality of dummy memory cells are not connected to the control circuit.

* * * * *